United States Patent
Lin et al.

(10) Patent No.: US 10,457,548 B2
(45) Date of Patent: Oct. 29, 2019

(54) INTEGRATING MEMS STRUCTURES WITH INTERCONNECTS AND VIAS

(71) Applicant: Intel Corporation, Santa Clara, CA (US)

(72) Inventors: Kevin Lai Lin, Beaverton, OR (US); Chytra Pawashe, Beaverton, OR (US); Raseong Kim, Hillsboro, OR (US); Ian A. Young, Portland, OR (US); Kanwal Jit Singh, Portland, OR (US); Robert L. Bristol, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/573,342

(22) PCT Filed: Jun. 22, 2015

(86) PCT No.: PCT/US2015/037024
§ 371 (c)(1),
(2) Date: Nov. 10, 2017

(87) PCT Pub. No.: WO2016/209207
PCT Pub. Date: Dec. 29, 2016

(65) Prior Publication Data
US 2018/0086627 A1  Mar. 29, 2018

(51) Int. Cl.
*B81B 7/00* (2006.01)
*B81C 1/00* (2006.01)
*H01L 21/768* (2006.01)

(52) U.S. Cl.
CPC .......... *B81B 7/007* (2013.01); *B81C 1/00246* (2013.01); *B81C 1/00301* (2013.01);
(Continued)

(58) Field of Classification Search
CPC ............ B81B 7/007; B81B 2203/0118; B81B 2207/094; B81B 2207/07; B81B 2207/015; B81B 7/02; B81C 1/00301; B81C 2201/014; B81C 2203/0714; B81C 2201/0109; H01L 21/768; H01L 21/36; H01L 29/84; H01L 23/48; H01L 21/02; H01L 27/04; H01L 21/283; H01L 21/8238; H01H 57/00
See application file for complete search history.

(56) References Cited

U.S. PATENT DOCUMENTS

2005/0068608 A1* 3/2005 Campbell .......... B81C 1/00595
                                                         359/291
2009/0071807 A1   3/2009 Kominato et al.
(Continued)

OTHER PUBLICATIONS

International Preliminary Report on Patentability for International Patent Application No. PCT/US2015/037024, dated Jan. 4, 2018, 10 pages.
(Continued)

*Primary Examiner* — Selim U Ahmed
(74) *Attorney, Agent, or Firm* — Schwabe, Williamson & Wyatt, P.C.

(57) ABSTRACT

A conductive layer is deposited into a trench in a sacrificial layer on a substrate. An etch stop layer is deposited over the conductive layer. The sacrificial layer is removed to form a gap. In one embodiment, a beam is over a substrate. An interconnect is on the beam. An etch stop layer is over the beam. A gap is between the beam and the etch stop layer.

21 Claims, 13 Drawing Sheets

(52) U.S. Cl.
CPC .... *H01L 21/7682* (2013.01); *H01L 21/76829* (2013.01); *B81B 2203/0109* (2013.01); *B81B 2203/0118* (2013.01); *B81B 2207/015* (2013.01); *B81B 2207/07* (2013.01); *B81B 2207/092* (2013.01); *B81B 2207/094* (2013.01); *B81B 2207/095* (2013.01); *B81C 2201/014* (2013.01); *B81C 2201/0109* (2013.01); *B81C 2203/0714* (2013.01); *B81C 2203/0742* (2013.01); *B81C 2203/0771* (2013.01); *H01L 21/76807* (2013.01)

(56) References Cited

U.S. PATENT DOCUMENTS

| | | | | |
|---|---|---|---|---|
| 2010/0140669 | A1* | 6/2010 | Xie | B81B 3/007 257/254 |
| 2010/0181631 | A1* | 7/2010 | Lacey | B81B 3/007 257/415 |
| 2013/0334700 | A1* | 12/2013 | Singh | H01L 23/5222 257/774 |
| 2014/0183753 | A1 | 7/2014 | Ellis-Monaghan et al. | |
| 2014/0191385 | A1* | 7/2014 | Di-Giacomo | H01L 23/528 257/692 |

OTHER PUBLICATIONS

International Search Report and Written Opinion for International Patent Application No. PCT/US2015/037024 dated Mar. 10, 2016, 13 pgs.

\* cited by examiner

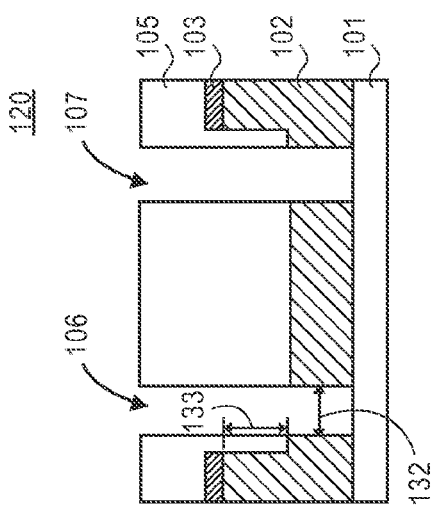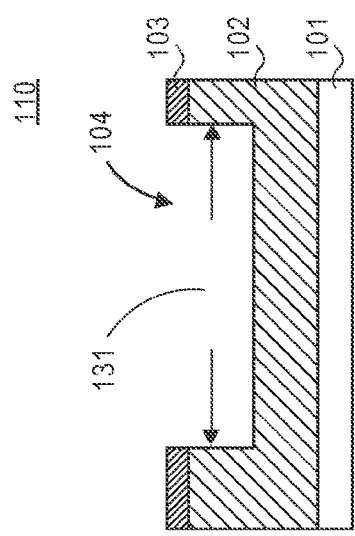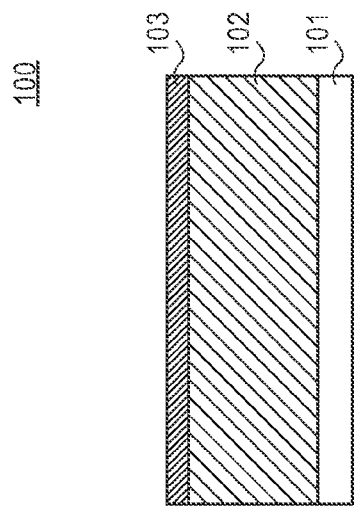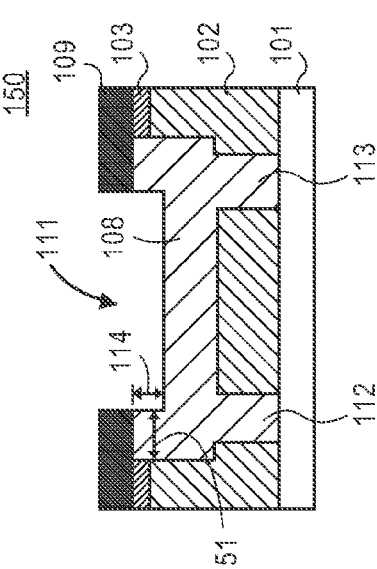

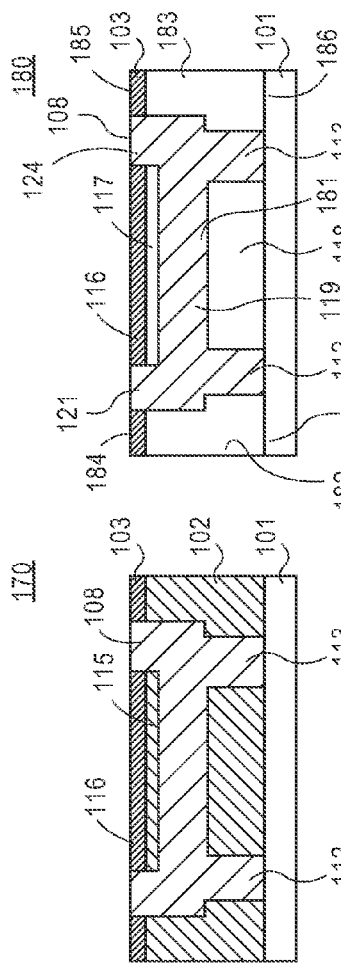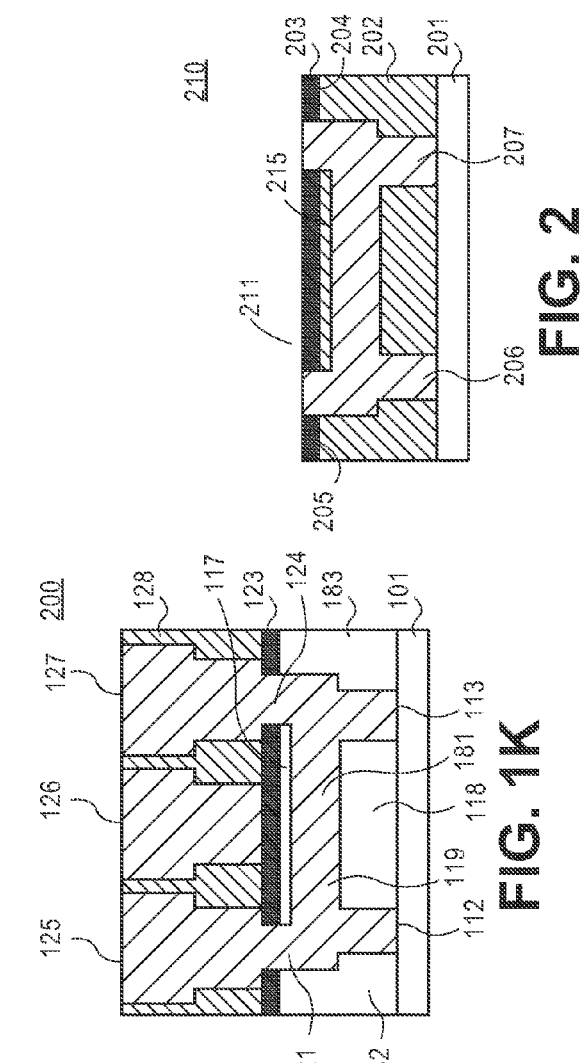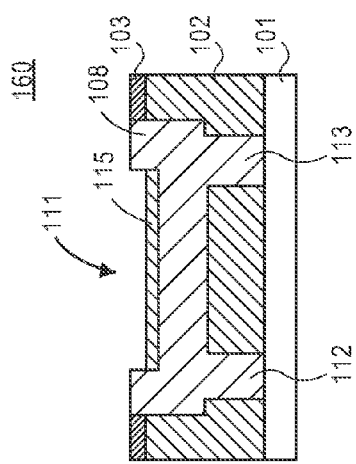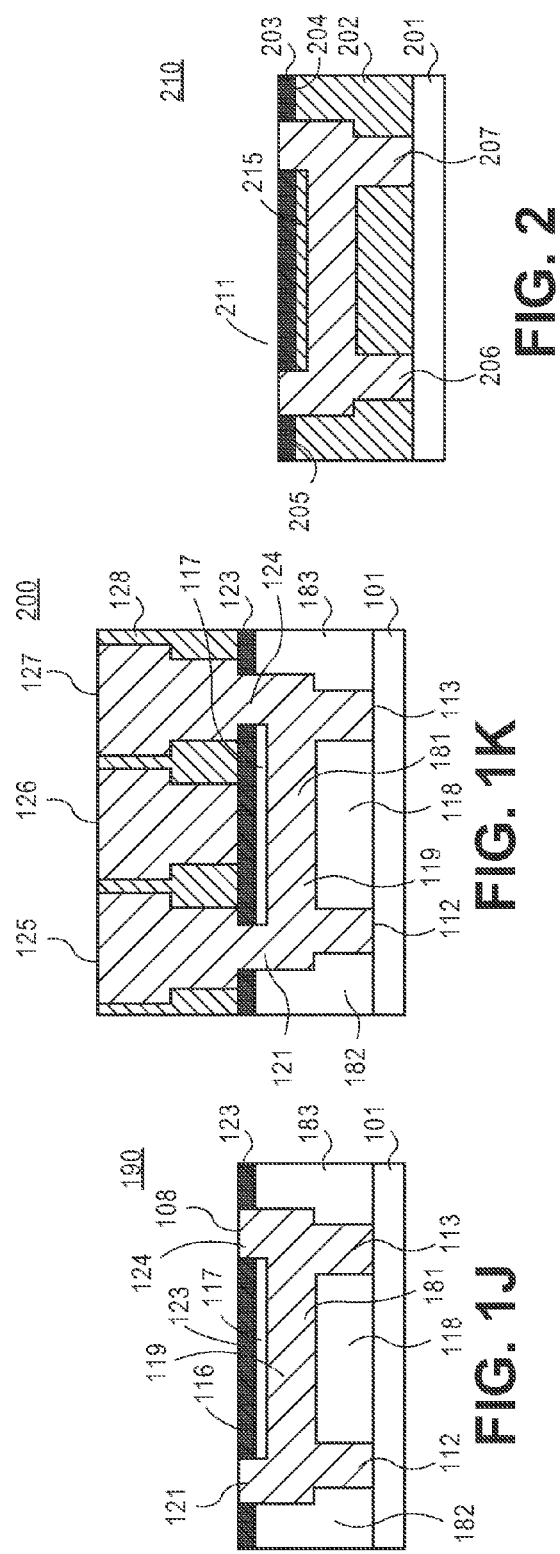

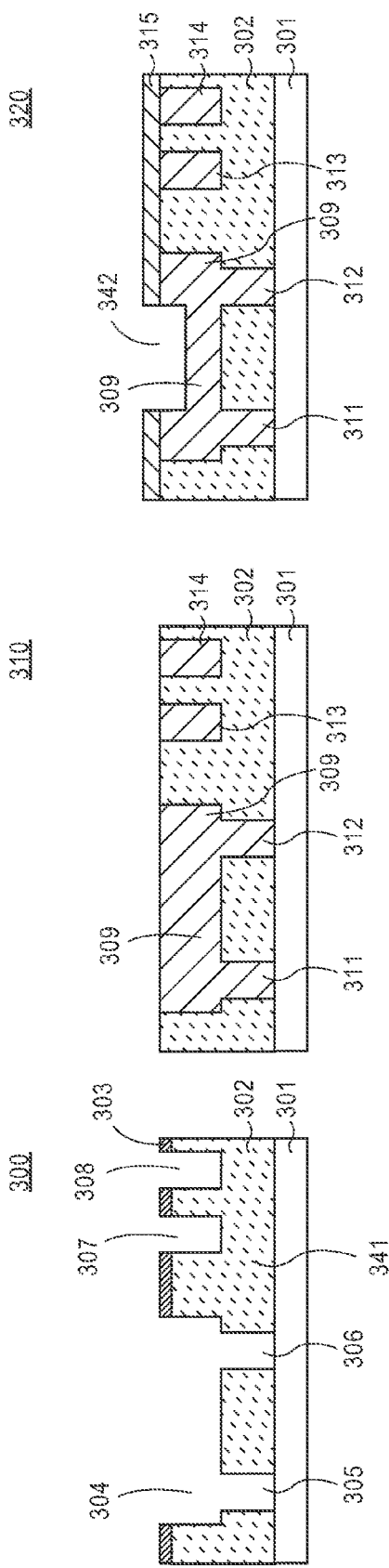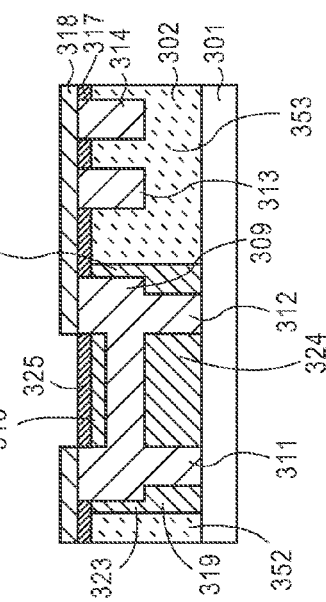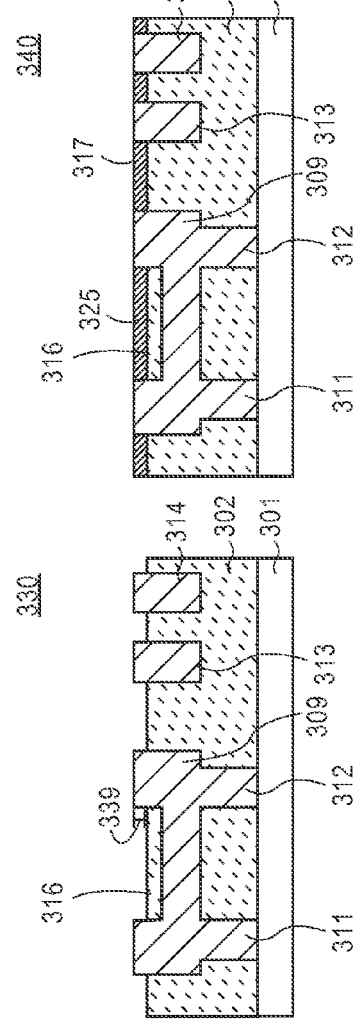
FIG. 3A    FIG. 3B    FIG. 3C
FIG. 3D    FIG. 3E    FIG. 3F

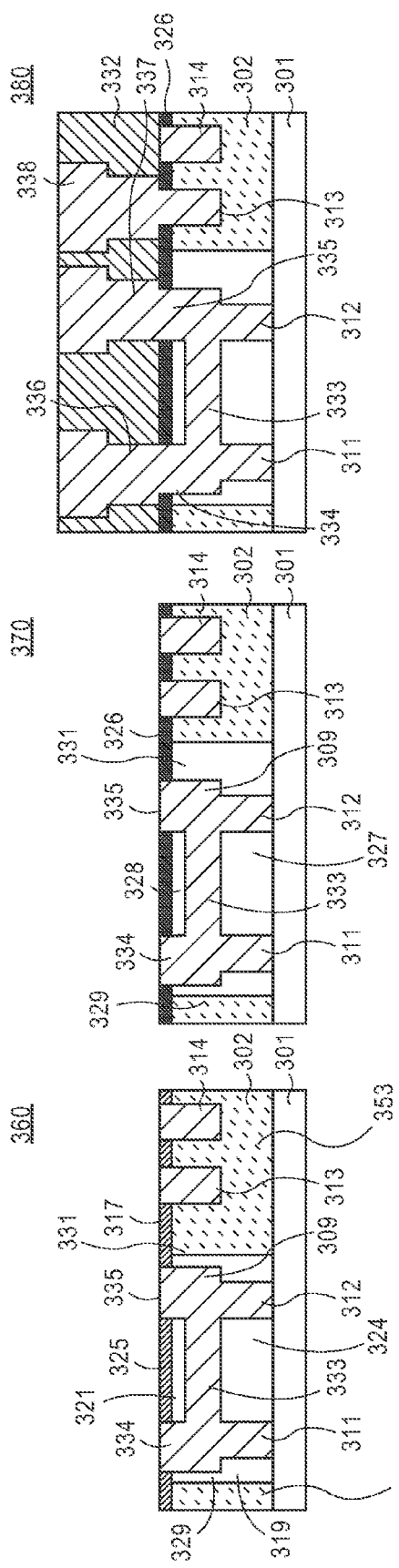

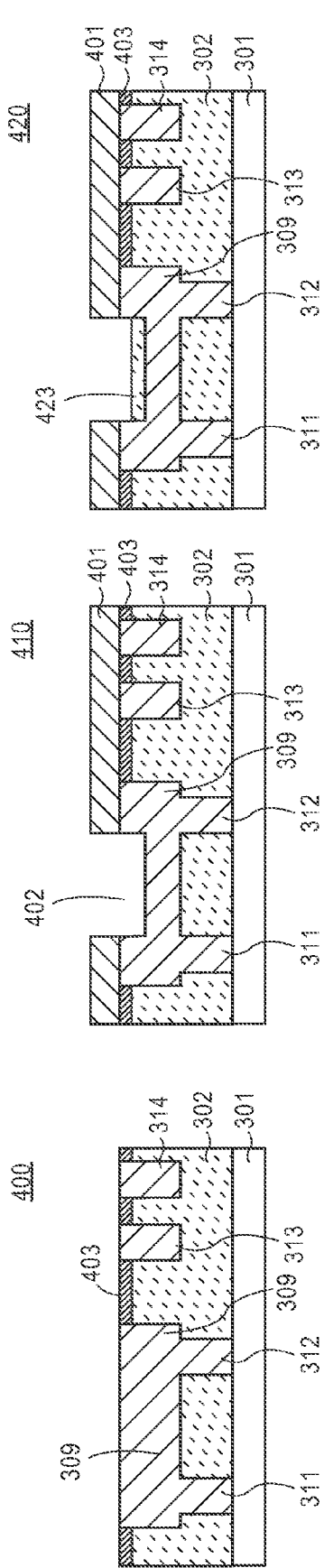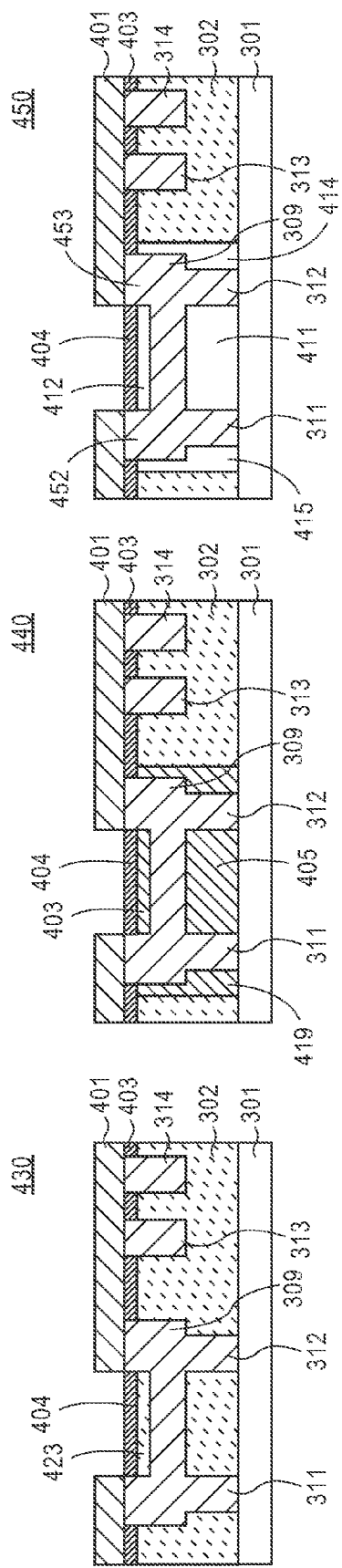

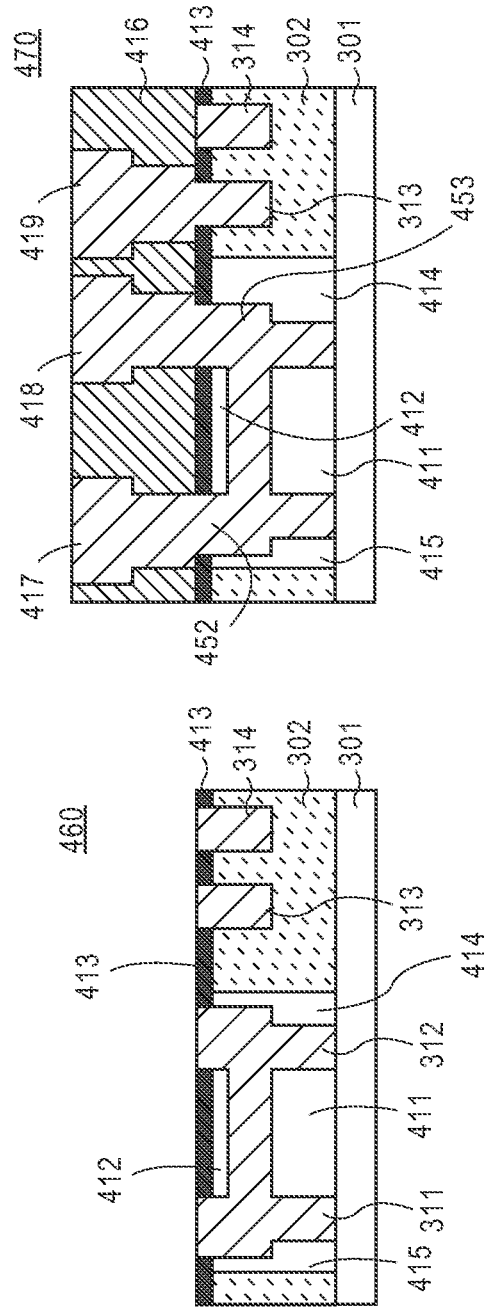

INTEGRATING MEMS STRUCTURES WITH INTERCONNECTS AND VIAS

CROSS-REFERENCE TO RELATED APPLICATION

This patent application is a U.S. National Phase Application under 35 U.S.C. § 371 of International Application No. PCT/US2015/037024, filed Jun.22, 2015, entitled "INTEGRATING MEMS STRUCTURES WITH INTERCONNECTS AND VIAS," which designates the United States of America, the entire disclosure of which is hereby incorporated by reference in its entirety and for all purposes.

FIELD

Embodiments as described herein relate to a field of electronic device manufacturing, and in particular, to a micro-electromechanical systems (MEMS) structures integration.

BACKGROUND

Generally, micro-electromechanical systems refer to miniaturized mechanical and electro-mechanical devices e.g., sensors, valves, gears, mirrors and actuators embedded in semiconductor chips. Currently, conventional electronic device packaging methods are reaching their limits, as the demands for miniaturization and higher density of devices continue to increase. Typically, MEMS components are integrated into a system at a package integration level. For the package integration, MEMS structures and complementary metal-oxide semiconductor (CMOS) transistors are fabricated on different silicon substrates, as discrete components. These different discrete components are then integrated into the package.

Typically, the MEMS processing and CMOS processing have different process requirements. One of the conventional MEMS integration techniques is a MEMS-first processing technique. According to the MEMS-first processing technique, the MEMS components are processed before transistors and interconnects. Another one of conventional MEMS integration techniques is a CMOS-first processing technique. According to the CMOS -first processing technique the transistors are processed before the MEMS processing.

Conventional MEMS integration techniques are bulky that leads to a "silicon area" penalty and increased manufacturing cost.

BRIEF DESCRIPTION OF THE DRAWINGS

Embodiments of the invention may best be understood by referring to the following description and accompanying drawings that are used to illustrate embodiments of the invention. In the drawings:

FIG. 1A shows a side view and a top view of a portion of an apparatus to provide an electronic device package according to one embodiment.

FIG. 1B is a view similar to FIG. 1A after patterning and etching an etch stop layer and a sacrificial layer to form a trench according to one embodiment.

FIG. 1C is a view similar to FIG. 1B, after forming via openings according to one embodiment.

FIG. 1D is a view similar to FIG. 1C, after the patterned hard mask layer is removed according to one embodiment.

FIG. 1E is a view similar to FIG. 1D after a conductive layer is deposited into the trench according to one embodiment.

FIG. 1F is a view similar to FIG. 1E after a portion of the conductive layer is removed to form a recess to form a MEMS device structure according to one embodiment.

FIG. 1G is a view similar to FIG. 1F after a sacrificial layer is deposited into the recess and the patterned hard mask layer is removed according to one embodiment.

FIG. 1H is a view similar to FIG. 1G after an etch stop layer is deposited on the sacrificial layer according to one embodiment.

FIG. 1I is a view similar to FIG. 1H after the sacrificial layers are removed according to one embodiment.

FIG. 1J is a view similar to FIG. 1I after stuffing the porous material of the etch stop layers to form a dense etch stop layer according to one embodiment.

FIG. 1K is a view similar to FIG. 1J after a next interconnect layer is formed according to one embodiment.

FIG. 2 is a side view of a portion of an electronic device after a sacrificial layer is deposited into a recess in a conductive layer according to another embodiment.

FIG. 3A shows a side view of a portion of an electronic device according to another embodiment.

FIG. 3B is a view similar to FIG. 3A after a conductive layer is deposited into a trench and via openings through the patterned hard mask layer according to one embodiment.

FIG. 3C is a view similar to FIG. 3B after a portion of the conductive layer is removed to form a recess to form a MEMS device according to one embodiment.

FIG. 3D is a view similar to FIG. 3C after a pore stuffed sacrificial layer is selectively deposited into the recess and the patterned hard mask layer is removed according to one embodiment.

FIG. 3E is a view similar to FIG. 3D after an etch stop layer is deposited on a pore stuffed sacrificial layer and portions of a pore stuffed sacrificial layer according to one embodiment.

FIG. 3F is a view similar to FIG. 3E after a patterned hard mask layer is deposited on the etch stop layer and pore stuffants are removed from the pores of the sacrificial layer and from the pores of a portion of the pore stuffed sacrificial layer according to one embodiment.

FIG. 3G is a view similar to FIG. 3F after the sacrificial layer and a portion of the sacrificial layer are selectively removed to form a MEMS device structure according to one embodiment.

FIG. 3H is a view similar to FIG. 3G after stuffing the porous material of the etch stop layer to form a dense etch stop layer according to one embodiment.

FIG. 3I is a view similar to FIG. 3H after a next interconnect layer is formed according to one embodiment.

FIG. 4A shows a side view of a portion of an electronic device according to another embodiment.

FIG. 4B is a view similar to FIG. 4A after a portion of the conductive layer is removed to form a recess to form a MEMS device according to one embodiment.

FIG. 4C is a view similar to FIG. 4B after a pore stuffed sacrificial layer is selectively deposited into the recess through a patterned hard mask layer according to one embodiment.

FIG. 4D is a view similar to FIG. 4C after an etch stop layer is deposited on a sacrificial layer according to one embodiment.

FIG. 4E is a view similar to FIG. 4D after pore stuffants are removed from the pores of the sacrificial layer and from the pores of a portion of the sacrificial layer according to one embodiment.

FIG. 4F is a view similar to FIG. 4E after a sacrificial layer and portion of the sacrificial layer are selectively removed to form a MEMS device structure according to one embodiment.

FIG. 4G is a view similar to FIG. 4F after stuffing the porous material of the etch stop layer to form a dense (stuffed) etch stop layer according to one embodiment.

FIG. 4H is a view similar to FIG. 4G after a next interconnect layer is formed according to one embodiment.

DETAILED DESCRIPTION

Methods and apparatuses to integrate micro-electromechanical systems (MEMS) structures with interconnect and via processing are described. Embodiments described herein integrate MEMS-like structures into complementary metal-oxide semiconductor (CMOS) back end of line (BEOL) (e.g., interconnect, via, or both) layers with compatible processing.

Generally, the back end of line (BEOL) refers to a portion of IC fabrication where the individual devices (e.g., transistors, capacitors, resistors, or other passive and active electronic devices) are interconnected with wiring on a wafer. Typically, BEOL involves fabricating contacts, insulating layers, metal levels, interconnects, vias, and bonding sites for chip-to-package connections. Embodiments of integrating MEMS with interconnect and via processing described herein advantageously provide more space on the substrate that can be used for wiring that decreases the "silicon area" penalty and manufacturing cost comparing with conventional MEMS techniques. Concurrent MEMS and BEOL CMOS processing advantageously result in better sensor readout comparing with conventional MEMS techniques.

Figure 5A:
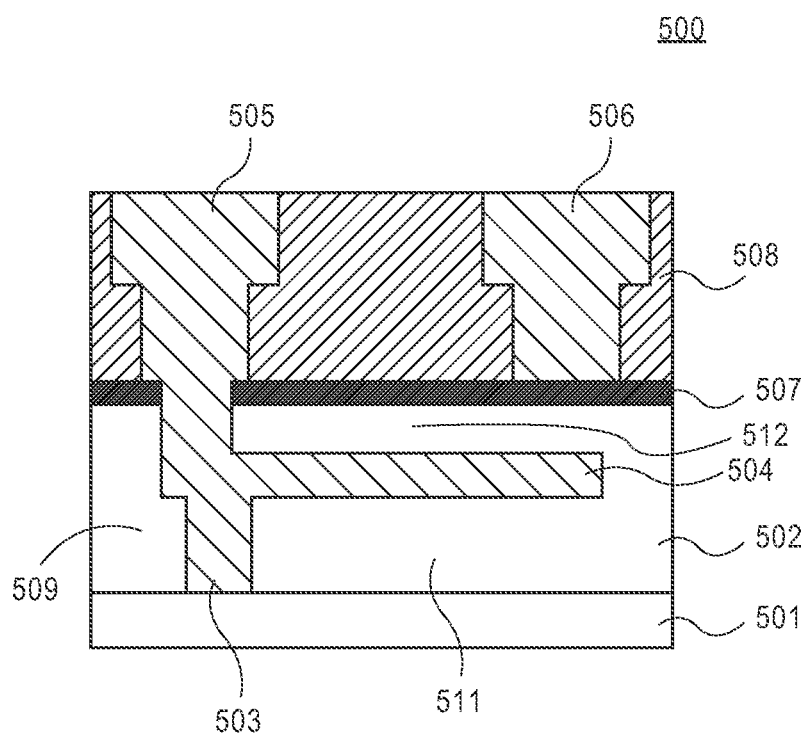
FIG. 5A is a side view of an electronic device comprising an integrated MEMS structure according to one embodiment.
Figure 5B:
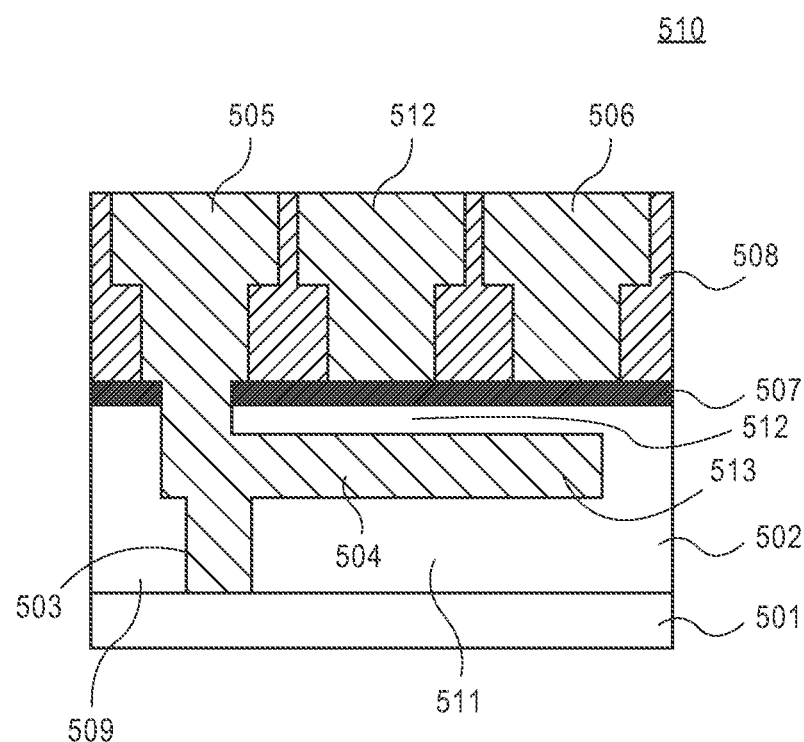
FIG. 5B is a side view of an electronic device comprising an integrated MEMS structure according to another embodiment.
Figure 7:
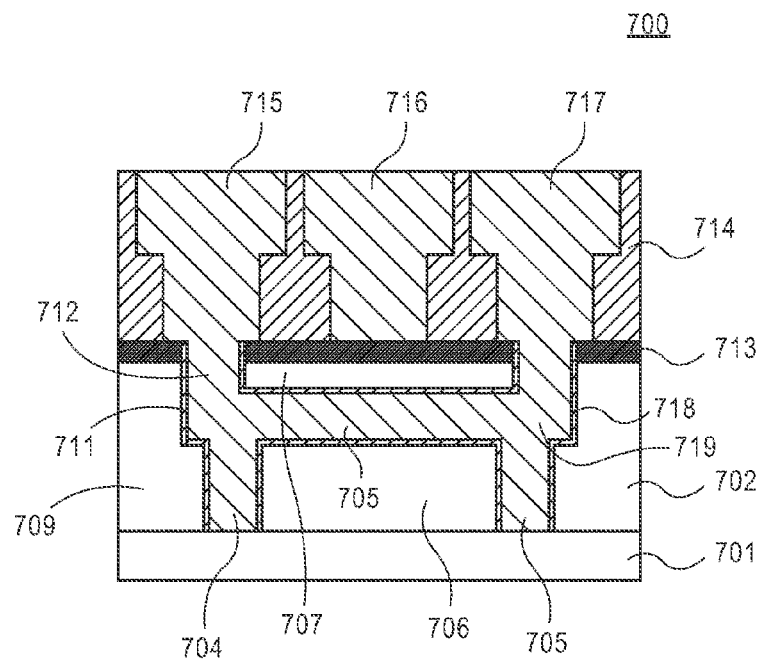
FIG. 7 is a side view of an electronic device comprising an integrated MEMS structure according to another embodiment.

In alternative embodiments, the MEMS structure integrated in a BEOL processing is a double-clamped beam (or plate) (e.g., as shown in FIGS. 1K, 3I and 4H), a single-clamped beam (or plate) (e.g., as shown in FIG. 5A), a double clamped beam (or plate) with one or more control/sense electrodes (e.g., as shown in FIG. 7), or a single-clamped beam (or plate) with one or more control/sense electrodes (as shown in FIG. 5B). In at least some embodiments, the BEOL metal interconnect forms the beam structure, and the beam structure is clamped by one or more vias. In at least some embodiments, integrating the MEMS structures into a BEOL processing involves removing an interlayer dielectric (ILD) surrounding metal lines and forming a metal interconnect having an additional metal recess to separate from a next layer processing, as described in further detail below.

In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention; however, the order of description should not be construed to imply that these operations are necessarily order dependent. In particular, these operations need not be performed in the order of presentation.

While certain exemplary embodiments are described and shown in the accompanying drawings, it is to be understood that such embodiments are merely illustrative and not restrictive, and that the embodiments are not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment. Thus, the appearance of the phrases, such as "one embodiment" and "an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment. While the exemplary embodiments have been described herein, those skilled in the art will recognize that these exemplary embodiments can be practiced with modification and alteration as described herein. The description is thus to be regarded as illustrative rather than limiting.

In one embodiment, a BEOL structure comprises a beam over a substrate. The beam is clamped by one or more vias. In one embodiment, a conductive layer is deposited into a trench in a sacrificial layer in a BEOL area on a substrate. An etch stop layer is deposited over the conductive layer. The sacrificial layer is removed to form a beam clamped by one or more vias. In one embodiment, the beam is a part of a MEMS device formed simultaneously with a complementary metal-oxide semiconductor (CMOS) BEOL processing.

In one embodiment, the MEMS device comprises a mechanical resonator. Typically, when used in a mechanical design, mechanical resonators have a higher quality factor (Q) than electrical RLC resonators. The mechanical resonators can also be used as mass and particle sensors where particles that deposit or functionalize on the resonator surface change the resonant characteristics of such resonator.

FIG. 1A shows a side view 100 of a portion of an electronic device according to one embodiment. An etch stop layer 103 is deposited on a sacrificial layer 102 on a substrate 101. In one embodiment, sacrificial layer 102 is located in a BEOL area of the electronic device. In an embodiment, the substrate 101 comprises a semiconductor material, e.g., silicon (Si). In one embodiment, substrate 101 is a monocrystalline Si substrate. In another embodiment, substrate 101 is a polycrystalline silicon substrate. In another embodiment, substrate 101 represents a previous interconnect layer. In yet another embodiment, substrate 101 is an amorphous silicon substrate. In alternative embodiments, substrate 101 includes silicon, germanium ("Ge"), silicon germanium ("SiGe"), a III-V materials based material e.g., gallium arsenide ("GaAs"), or any combination thereof. In one embodiment, the substrate 101 includes metallization interconnect layers for integrated circuits. In at least some embodiments, the substrate 101 includes electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing. In at least some embodiments, the substrate 101 includes interconnects, for example, vias, configured to connect the metallization layers.

In an embodiment, substrate 101 is a semiconductor-on-isolator (SOI) substrate including a bulk lower substrate, a middle insulation layer, and a top monocrystalline layer. The top monocrystalline layer may comprise any material listed above, e.g., silicon.

In various implementations, the substrate can be, e.g., an organic, a ceramic, a glass, or a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present invention.

In one embodiment, sacrificial layer 102 is a low-k interlayer dielectric (ILD) layer. In one embodiment, sacrificial layer 102 is a titanium nitride (TiN) layer. In alternate embodiments, sacrificial layer 102 comprises organic materials, inorganic materials, or both. In alternate embodiments, sacrificial layer 102 is an oxide layer, e.g., a silicon oxide layer (e.g., SiO2), an aluminum oxide (e.g., Al2O3), a carbon doped oxide (e.g., a carbon doped silicon oxide), or a carbon layer. In another embodiment, sacrificial layer 102 is a polymer layer, e.g., a polystyrene layer , or other sacrificial layer.

In one embodiment, the thickness of the sacrificial layer 102 is determined by the thickness of the interconnect stack. In one embodiment, the sacrificial layer 102 is deposited to the thickness from about 50 nanometers (nm) to about 200 nm.

In an embodiment, sacrificial layer 102 is deposited on substrate 101 using one of deposition techniques, such as but not limited to a chemical vapour deposition ("CVD"), e.g., a plasma enhanced chemical vapour deposition ("PECVD"), a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of electronic device manufacturing.

In one embodiment, the etch stop layer 103 comprises pores (voids). Generally, porosity refers to a measure of the void (i.e., "empty") spaces over the total volume of the material. In one embodiment etch stop layer has a porosity of at least 25%. In more specific embodiment, the porosity of the etch stop layer 103 is greater than 60%.

In one embodiment, etch stop layer 103 is a doped dielectric layer. In one embodiment, etch stop layer 103 is a carbon doped silicon oxide (SiOC) layer. In one embodiment, the porosity of the SiOC etch stop layer 103 increases as the carbon content increases.In one embodiment, etch stop layer 103 is a low dielectric constant (k) layer. In one embodiment, etch stop layer 103 has the dielectric constant k less or equal to 2.1. In another embodiment, etch stop layer 103 is a high-k dielectric layer having a dielectric constant k greater than that of silicon oxide.

In alternate embodiments, etch stop layer 103 is an oxide layer, e.g., a silicon oxide layer a carbon doped silicon oxide, a fluorine-doped silicon oxide, a metal oxide, e.g., a titanium oxide, an aluminum oxide, or any other metal oxide; a hydrogensilesquioxane (HSQ), a fluorinated amorphous carbon, a methylsesquioxane (MSQ), a nitride layer, e.g., a silicon nitride, a titanium nitride, a silicon oxide nitride, silicon carbide, or other etch stop layer. In one embodiment, the thickness of the etch stop layer 103 is from about 5 nm to about 20 nm. In more specific embodiment, the thickness of the etch stop layer 103 is about 10 nm.

In an embodiment, etch stop layer 103 is deposited on sacrificial layer 102 using one of deposition techniques, such as but not limited to a blanket deposition, a chemical vapour deposition ("CVD"), e.g., a plasma enhanced chemical vapour deposition ("PECVD"), a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of electronic device manufacturing.

FIG. 1B is a view 110 similar to FIG. 1A after patterning and etching the etch stop layer and sacrificial layer to form a trench according to one embodiment. A trench 104 is formed in a sacrificial layer 102. In one embodiment, a length 131 of the trench is determined by design of a MEMS structure. In one embodiment, length 131 of the trench is from about 100 nm to about 10 microns (μm). Trench 104 is formed by patterning and etching the etch stop layer 103 on sacrificial layer 102 using one or more patterning and etching techniques known to one of ordinary skill in the art of electronic device manufacturing.

FIG. 1C is a view 120 similar to FIG. 1B, after forming via openings 106 and 107 according to one embodiment. As shown in FIG. 1C, a patterned hard mask layer 105 is formed on portions of the etch stop layer 103 and sacrificial layer. A via opening 106 and a via opening 107 are formed through the patterned hard mask layer 105 and the bottom of the trench 104 down to substrate 101, as shown in FIG. 1C. In one embodiment, a width 132 of the via opening is similar to a depth 133 of the trench 104. In one embodiment, a width 132 of the via opening is from about 20 nm to about 100 nm.

In one embodiment, hard mask layer 105 is a nitride layer, e.g., a silicon nitride, a silicon oxide nitride, or any other hard mask layer known to one of ordinary skill in the art of electronic device manufacturing. The patterned mask layer 105 can be formed using one of the hard mask layer deposition and patterning techniques known to one of ordinary skill in the art of electronic device manufacturing. In one embodiment, via openings 106 and 107 are formed by etching the sacrificial layer 102 through the patterned hard mask layer 105 using one or more etching techniques e.g., a dry etching, a wet etching, or both etching techniques known to one of ordinary skill in the art of electronic device manufacturing.

FIG. 1D is a view 130 similar to FIG. 1C, after the patterned hard mask layer 105 is removed according to one embodiment. As shown in FIG. 1D, trench 104 and via openings 106 and 107 are formed in sacrificial layer 102. In one embodiment, the trench 104 and via openings 106 and 107 are formed as a part of a BEOL processing. In one embodiment, the hard mask layer 105 is removed using one of hard mask layer removal techniques known to one of ordinary skill in the art of electronic device manufacturing.

FIG. 1E is a view 140 similar to FIG. 1D after a conductive layer 108 is deposited into trench 104 according to one embodiment. As shown in FIG. 1E, the conductive layer 108 fills trench 104. Conductive layer 108 fills openings 106 and 107 to form conductive vias 112 and 113 respectively. The conductive layer 108 is flushed with portions of the etch stop layer 103 on sacrificial layer 102.

In one embodiment, the conductive layer 108 comprises a copper layer, a tantalum layer, a tungsten layer, a ruthenium layer, or any combination thereof. In alternative embodiments, examples of the conductive materials that may be used for the conductive layer 108 include, but are not limited to, metals, e.g., copper, tantalum, tungsten, ruthenium, titanium, hafnium, zirconium, aluminum, silver, tin, lead, metal alloys, metal carbides, e.g., hafnium carbide, zirconium carbide, titanium carbide, tantalum carbide, aluminum carbide, other conductive materials, or any combination thereof. In more specific embodiment, the conductive layer 108 is a copper layer. In another embodiment, the conductive layer 108 has the mechanical stiffness higher than that of copper.

In another embodiment, a metal liner (not shown) acting as a conductive layer is deposited on the sidewalls and bottom of the trench 104, bottom of the recess 111, and sidewalls of the via openings 106 and 107. In one embodiment, conductive layer 108 is deposited on the metal liner. In another embodiment, an insulating layer is deposited on the metal liner. The metal liner can be deposited using one of conductive layer deposition techniques, such as but not limited to electroless plating, electroplating, sputtering, chemical vapor deposition (CVD), metalorganic chemical vapor deposition (MOCVD), atomic layer deposition (ALD), or any other conductive layer deposition technique known to one of ordinary skill in the art of electronic device manufacturing. An embodiment of the electronic device comprising a metal liner is described in further detail below with respect to FIG. 7.

In alternative embodiments, conductive layer 108 is deposited using one of conductive layer deposition techniques, e.g., electroless plating, electroplating, sputtering, chemical vapor deposition (CVD), metalorganic chemical vapor deposition (MOCVD), atomic layer deposition (ALD), or any other conductive layer deposition technique known to one of ordinary skill in the art of electronic device manufacturing. In one embodiment, the conductive layer 108 is flushed with portions of the etch stop layer 103 on sacrificial layer 102 using one of the chemical-mechanical polishing (CMP) techniques known to one of ordinary skill in the art of electronic device manufacturing.

FIG. 1F is a view 150 similar to FIG. 1E after a portion of the conductive layer 108 is removed to form a recess 111 to form a MEMS device structure according to one embodiment. As shown in FIG. 1F, a patterned hard mask layer 109 is deposited on the conductive layer 108 and etch stop layer 103. In one embodiment, hard mask layer 109 is a nitride layer, e.g., a silicon nitride, a silicon oxide nitride, or any other hard mask layer known to one of ordinary skill in the art of electronic device manufacturing. The patterned mask layer 109 can be formed using one of the hard mask layer deposition and patterning techniques known to one of ordinary skill in the art of electronic device manufacturing. In one embodiment, recess 111 is formed in an area of a MEMS device by etching the conductive layer 108 through the patterned hard mask layer 109 down to a depth 114 using one or more etching techniques e.g., a dry etching, a wet etching, or both etching techniques known to one of ordinary skill in the art of electronic device manufacturing. In more specific embodiment, the recess 111 in the conductive layer 108 of copper is formed by wet etching using a citric acid. In one embodiment, the depth 114 of the recess is determined by a MEMS device design. In one embodiment, the depth 114 of the recess is from about 10 nm to about 30 nm. In more specific embodiment, the depth 114 is about 20 nm. The width of each conductive sidewall of the recess, such as width 151 is determined by a MEMS device design. In one embodiment, the width 151 is from about 20 nm to about 30 nm.

FIG. 1G is a view 160 similar to FIG. 1F after a sacrificial layer 115 is selectively deposited into the recess 111 and patterned hard mask layer 109 is removed according to one embodiment. In one embodiment, the recess 111 in the area of the MEMS device is back-filled with sacrificial layer 115 through the patterned hard mask layer 109. In one embodiment, the material of the sacrificial layer 115 is similar to the material of the sacrificial layer 102. In another embodiment, the material of the sacrificial layer 115 is different from the material of the sacrificial layer 102.

In one embodiment, sacrificial layer 115 is a low-k interlayer dielectric (ILD) layer. In one embodiment, sacrificial layer 115 is TiN layer. In alternate embodiments, sacrificial layer 115 comprises organic materials, inorganic materials, or both. In alternate embodiments, sacrificial layer 115 is an oxide layer, e.g., a silicon oxide layer (e.g., SiO2), an aluminum oxide (e.g., Al2O3), a carbon doped oxide (e.g., a carbon doped silicon oxide), a carbon layer. In another embodiment, sacrificial layer 102 is a polymer layer, e.g., a polystyrene layer, or other sacrificial layer.

In one embodiment, the sacrificial layer 115 is deposited and then etched back to a predetermined thickness. In one embodiment, the sacrificial layer 115 is deposited to the thickness to flush with the top portions of the sacrificial layer 102. In one embodiment, the sacrificial layer 115 is deposited to the thickness from about 5 nm to about 20 nm. In more specific embodiment, the sacrificial layer 115 is deposited to the thickness of about 10 nm.

In an embodiment, sacrificial layer 115 is selectively deposited through patterned hard mask layer 109 using one of deposition techniques, such as but not limited to a chemical vapour deposition ("CVD"), e.g., a plasma enhanced chemical vapour deposition ("PECVD"), a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of electronic device manufacturing. In one embodiment, the patterned hard mask layer 109 is removed using one of the hard mask layer removal techniques known to one of ordinary skill in the art of electronic device manufacturing.

FIG. 1H is a view 170 similar to FIG. 1G after an etch stop layer 116 is deposited on sacrificial layer 115 according to one embodiment. In one embodiment, etch stop layer 116 is selectively deposited on sacrificial layer 115 through a patterned hard mask (not shown). The etch stop layer 116 is flushed with top portions of the conductive sidewalls of the recess 111 and portions of the etch stop layer 103 on sacrificial layer 102, as shown in FIG. 1H. In one embodiment, the material of the etch stop layer 116 is similar to the material of the etch stop layer 103. In another embodiment, the material of the etch stop layer 116 is different from the material of the etch stop layer 103.

In one embodiment, the etch stop layer 116 comprises pores (voids). In one embodiment etch stop layer has a porosity of at least 25%. In more specific embodiment, the porosity of the etch stop layer 103 is greater than 60%. In one embodiment, etch stop layer 116 is a doped dielectric layer. In one embodiment, etch stop layer 116 is a carbon doped silicon oxide (SiOC) layer. In one embodiment, etch stop layer 116 is a low dielectric constant (k) layer. In one embodiment, etch stop layer 116 has the dielectric constant k less than 3. In another embodiment, etch stop layer 103 is a high-k dielectric layer having a dielectric constant k greater than that of silicon oxide.

In alternate embodiments, etch stop layer 116 is an oxide layer, e.g., a silicon oxide layer, a carbon doped silicon oxide, a fluorine-doped silicon oxide, a metal oxide, e.g., a titanium oxide, an aluminum oxide, or any other metal oxide; a hydrogensilesquioxane, a fluorine-doped silicon oxide, a fluorinated amorphous carbon, a methylsesquioxane (MSQ), a nitride layer, e.g., a silicon nitride, a titanium nitride, a silicon oxide nitride, silicon carbide, or other etch stop layer. In one embodiment, the thickness of the etch stop layer 116 is from about 5 nm to about 20 nm. In more specific embodiment, the thickness of the etch stop layer 116 is about 10 nm.

In an embodiment, etch stop layer 116 is deposited using one of deposition techniques, such as but not limited to a blanket deposition, a chemical vapour deposition ("CVD"), e.g., a plasma enhanced chemical vapour deposition ("PECVD"), a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of electronic device manufacturing.

FIG. 1I is a view 180 similar to FIG. 1H after the sacrificial layers 102 and 115 are removed according to one embodiment. As shown in FIG. 1I, sacrificial layers 115 and 102 are removed through porous etch stop layers 116 and 103 selective to other materials present in the interconnect stack. In one embodiment, the sacrificial layers are removed using a wet etching technique. That is, the porous etch stop layers are permeable to a wet chemistry which dissolves the sacrificial layers, so that a free-standing MEMS device structure 181 is formed. In one embodiment, a hard mask is used to remove the sacrificial layer only in areas of the MEMS devices.

In one embodiment, the sacrificial layers 115 and 102 of TiN are removed through the etch stop layer of the porous carbon doped silicon oxide using a timed wet etch with a chemistry comprising a hydrogen peroxide. In one embodiment, the sacrificial layers of TiN are removed through the etch stop layer of the porous carbon doped silicon oxide by a wet etch using a Standard Clean (SC) chemistry, such as SC 1, SC2, or both. The SC1 and SC2 chemistries are known to one of ordinary skill in the art of electronic device manufacturing. In one embodiment, the sacrificial layers 115 and 102 of TiN are wet etched at an elevated temperature greater than a room temperature. In one embodiment, the elevated temperature to wet etch the sacrificial layers through the etch stop layer is from about 50 degrees C. to about 75 degrees C.

As shown in FIG. 1I, MEMS device structure 181 comprises a double clamped beam (or plate) 119 over substrate 101, an interconnect contact region 121 and an interconnect contact region 124 are on beam 119. A gap 117 is between the beam 119 and etch stop layer 116, so that etch stop layer 116 is separated from the beam 119 by gap 117. A gap 118 is formed underneath the beam 119, so that beam 119 is separated from substrate 101 by gap 118. Conductive via 112 is underneath one end of the beam 119 and conductive via 113 is underneath other end of the beam 119, as shown in FIG. 1I. A gap 182 is formed between a portion 184 of the etch stop layer 103 outside the MEMS structure 181 and a portion 187 of the substrate 101. A gap 183 is formed between a portion 185 of the etch stop layer 103 outside the MEMS structure 181 and a portion 186 of the substrate 101, as shown in FIG. 1I. In one embodiment, each of the gaps 117, 118, 182 and 183 is an air gap.

FIG. 1J is a view 190 similar to FIG. 1I after stuffing the porous material of the etch stop layers 116 and 103 to form a dense etch stop layer 123 according to one embodiment. The porous etch stop layers 116 and 103 are converted to a dense (stuffed) etch stop layer 123 to increase hermeticity and mechanical rigidity, to increase a k value to at least 4, and to improve patterning fidelity. The stuffed etch stop layer 123 is used to increase the capacitance and to increase control of the control electrode and sense electrode formed later on in a process. In one embodiment, stuffed etch stop layer 123 acts as a hermetic barrier for a next layer patterning. In one embodiment, the porous material of the etch stop layer is stuffed by filling the pores with a stuffant material, curing the porous material, or both. In one embodiment, the stuffant material to fill the pores of the etch stop layer is a polymer (e.g., polystyrene or other polymer), a titanium nitride, or other stuffant material. In one embodiment, the pores of the etch stop layer are filled with the polymer stuffant at a temperature greater than a room temperature. In one embodiment, the porous etch stop layer is cured using an electron beam curing, a ultraviolet (UV) light curing, annealing, or any combination thereof. In one embodiment, the etch stop layer is stuffed at the temperature of at least 400 degrees C.

FIG. 1K is a view 200 similar to FIG. 1J after a next interconnect layer is formed according to one embodiment. In one embodiment, the next layer comprises an insulating layer 128 deposited on the stuffed etch stop layer 123. In an embodiment, insulating layer 128 is an interlayer dielectric (ILD) layer. In one embodiment, insulating layer 128 is an oxide layer, e.g., a silicon oxide layer. In another embodiment, insulating layer 128 is a nitride layer, e.g., silicon nitride layer. In alternative embodiments, insulating layer 128 is an aluminum oxide, silicon oxide nitride, other oxide/nitride layer, any combination thereof, or other electrically insulating layer determined by an electronic device design. Interconnects 125 and 127 are formed through insulating layer 128 on contact regions 121 and 124 respectively. An electrode 126 is formed on the stuffed etch stop layer 123. In one embodiment, electrode 126 is a control electrode, a sense electrode, or both. In one embodiment, the next layer is formed using a BEOL processing known to one of ordinary skill in the art of electronic device manufacturing.

FIG. 2 is a side view 210 of a portion of an electronic device after a sacrificial layer 215 is deposited into a recess 211 in a conductive layer 208 according to another embodiment. As shown in FIG. 2, a sacrificial layer 202 is deposited on a substrate 201. A conductive layer 208 is deposited into a trench 204 and via openings 206 and 207 in sacrificial layer 202, as described above with respect to FIG. 1E. The trench 204 and via openings 206 and 207 can be formed using one or more patterning and etching techniques known to one of ordinary skill in the art of electronic device manufacturing. Recess 211 is formed in conductive layer 208 and sacrificial layer 115 is deposited in the recess 211. In one embodiment, substrate 201 represents substrate 101, sacrificial layer 202 represents sacrificial layer 102, conductive layer 208 represents conductive layer 108, recess 211 represents recess 111, and sacrificial layer 215 represents sacrificial layer 115. As shown in FIG. 2, an etch stop layer 203 is deposited on portions 204 and 205 of the sacrificial layer 202 outside trench 211 and sacrificial layer 215. In one embodiment, etch stop layer 203 represents the etch stop layers 103 and 116. The embodiment shown in FIG. 2 is different from the embodiment shown in FIG. 1H in that the etch stop layer 203 is deposited on portions 204 and 205 of the sacrificial layer 202 outside trench 211 and on sacrificial layer 215 simultaneously. That is, the etch stop layer 203 is deposited on portions 204 and 205 of the sacrificial layer 202 outside trench 211 after the sacrificial layer 215 is formed. In one embodiment, after depositing the etch stop layer 203 the sacrificial layers 202 and 215 are removed to form a MEMS device structure, the etch stop layer 203 is stuffed, and a next interconnect layer is formed on the stuffed etch stop layer and the MEMS device structure using techniques as described above with respect to FIGS. 1I, 1J, and 1K.

FIGS. 3A-3I and 4A-4H illustrate embodiments where the sacrificial layer is a pore stuffed sacrificial layer. In one embodiment, the sacrificial layer susceptibility to a wet chemistry is modulated by the presence of the pore stuffant. The pore stuffant is selectively removed from a portion of the sacrificial layer in an area of a MEMS device. Then the portion of the sacrificial layer from which the pore stuffant has been removed is selectively removed to form a free standing MEMS device structure, as described in further detail below.

FIG. 3A shows a side view 300 of a portion of an electronic device according to another embodiment. A patterned hard mask layer 303 is deposited on a sacrificial layer 302 on a substrate 301. In one embodiment, substrate 301 represents substrate 101. In one embodiment, sacrificial layer 302 is a pore stuffed sacrificial layer. That is, sacrificial layer 302 has pores, such as a pore 341 filled with a stuffant, e.g, a polymer, or other stuffant. In one embodiment, the susceptibility to a wet etch chemistry of the sacrificial layer 302 is modulated by the presence of the stuffant. For example, as the amount of the pore stuffant in the sacrificial layer 302 increases, the susceptibility of the sacrificial layer 302 to the wet etch chemistry decreases. In one embodiment, the pore stuffed sacrificial layer 302 is not susceptible to the wet chemistry which removes the porous sacrificial layer from which the pore stuffant has been removed, as described in further detail below.

In one embodiment, the stuffant is a polymer (e.g., polystyrene or other polymer), a titanium nitride. In one embodiment, pore stuffed sacrificial layer 302 is a titanium nitride (TiN) layer having pores filled with a stuffant, such as a polymer, or other stuffant. In alternate embodiments, the pore stuffed sacrificial layer 302 is an oxide layer, e.g., a silicon oxide layer(e.g., SiO2), an aluminum oxide(e.g., Al2O3), a carbon doped oxide (e.g., a carbon doped silicon oxide), or a carbon layer. or other sacrificial layer having pores stuffed with a stuffant. In one embodiment, the pore stuffed sacrificial layer 302 is a carbon doped oxide having a porosity in an approximate range from about 25% to about 60% . In one embodiment, the pore stuffed sacrificial layer 302 has a k value greater than 4.

In one embodiment, the thickness of the sacrificial layer 302 is similar to the thickness of the sacrificial layer 102. In an embodiment, sacrificial layer 302 is deposited on substrate 301 using one of deposition techniques described above with respect to FIG. 1A.

A trench 304 is formed in the pore stuffed sacrificial layer 302. In one embodiment, the width of the trench 304 is determined by design of a MEMS structure. In one embodiment, the lengthof the trench 304 is from about 100 nm to about 10 microns (μm). Trench 304 is formed using one or more patterning and etching techniques known to one of ordinary skill in the art of electronic device manufacturing.

Via openings 305, 306, 307 and 308 are formed in the pore stuffed sacrificial layer 302, as shown in FIG. 3A. In one embodiment, the width of the via openings is similar to the depth of the trench 304. In one embodiment, the width of the via openings is from about 20 nm to about 200 nm. In one embodiment, via openings 305, 306, 307 and 308 are formed using one or more patterning and etching techniques known to one of ordinary skill in the art of electronic device manufacturing. In one embodiment, the trench 304 and via openings 305, 306, 307 and 308 are formed as a part of a BEOL processing.

As shown in FIG. 3A, a patterned hard mask layer 303 is formed on portions of the pore stuffed sacrificial layer 302. In one embodiment, patterned hard mask layer 303 is a nitride layer, e.g., a silicon nitride, a silicon oxide nitride, or any other hard mask layer known to one of ordinary skill in the art of electronic device manufacturing. The patterned hard mask layer 303 can be formed using one of the hard mask layer deposition and patterning techniques known to one of ordinary skill in the art of electronic device manufacturing.

FIG. 3B is a view 310 similar to FIG. 3A after a conductive layer 309 is deposited into trench 304 and via openings 305, 306, 307 and 308 through the patterned hard mask layer 303 according to one embodiment. As shown in FIG. 3B, the conductive layer 309 fills trench 304 and via openings 305, 306, 307 and 308 to form conductive vias 311, 312, 313 and 314 respectively. The conductive layer 309 is flushed with portions of the pore stuffed sacrificial layer 302. In one embodiment, conductive layer 309 comprises a copper layer, a tantalum layer, a tungsten layer, a ruthenium layer, or any combination thereof. In alternative embodiments, examples of the conductive materials that may be used for the conductive layer 309 include, but are not limited to, metals, e.g., copper, tantalum, tungsten, ruthenium, titanium, hafnium, zirconium, aluminum, silver, tin, lead, metal alloys, metal carbides, e.g., hafnium carbide, zirconium carbide, titanium carbide, tantalum carbide, aluminum carbide, other conductive materials, or any combination thereof. In more specific embodiment, the conductive layer 309 is a copper layer. In another embodiment, the conductive layer 309 has the mechanical stiffness higher than that of copper.

In another embodiment, a metal liner (not shown) acting as a conductive layer is deposited on the sidewalls and bottom of the trench 304 and sidewalls of the vias 311, 312, 313 and 314. In one embodiment, conductive layer 309 is deposited on the metal liner. In another embodiment, an insulating layer is deposited on the metal liner. The metal liner can be deposited using one of conductive layer deposition techniques, e.g., electroless plating, electroplating, sputtering, chemical vapor deposition (CVD), metalorganic chemical vapor deposition (MOCVD), atomic layer deposition (ALD), or any other conductive layer deposition technique known to one of ordinary skill in the art of electronic device manufacturing. An embodiment of the electronic device comprising a metal liner is described in further detail below with respect to FIG. 7.

In alternative embodiments, conductive layer 309 is deposited using one of conductive layer deposition techniques, e.g., electroless plating, electroplating, sputtering, chemical vapor deposition (CVD), metalorganic chemical vapor deposition (MOCVD), atomic layer deposition (ALD), or any other conductive layer deposition technique known to one of ordinary skill in the art of electronic device manufacturing. In one embodiment, the conductive layer 309 is flushed with portions of the pore stuffed sacrificial layer 302 using one of the CMP techniques known to one of ordinary skill in the art of electronic device manufacturing.

FIG. 3C is a view 320 similar to FIG. 3B after a portion of the conductive layer 309 is removed to form a recess 342 to form a MEMS device according to one embodiment. As shown in FIG. 3C, a patterned hard mask layer 315 is deposited on the conductive layer 309, conductive vias 313 and 314 and portions of the pore stuffed sacrificial layer 302. In one embodiment, hard mask layer 315 is a nitride layer, e.g., a silicon nitride, a silicon oxide nitride, or any other hard mask layer known to one of ordinary skill in the art of electronic device manufacturing. The patterned mask layer 315 can be formed using one of the hard mask layer deposition and patterning techniques known to one of ordinary skill in the art of electronic device manufacturing. In one embodiment, recess 342 is formed in an area of a MEMS device by etching the conductive layer 309 through the patterned hard mask layer 315 down to a predetermined depth using one or more etching techniques e.g., a dry etching, a wet etching, or both etching techniques known to one of ordinary skill in the art of electronic device manufacturing. In one embodiment, the recess 342 in the conductive layer of copper is formed by wet etching using a citric acid. In one embodiment, the depth of the recess 342 is determined by a MEMS device design. In one embodiment, the depth of the recess 342 is from about 10 nm to about 30 nm. In more specific embodiment, the depth of the recess 342 is about 20 nm. The width of each conductive sidewall of the recess 342 is determined by a MEMS device design. In one embodiment, the width of each conductive sidewall of the recess 342 is from about 20 nm to about 30 nm.

FIG. 3D is a view 330 similar to FIG. 3C after a pore stuffed sacrificial layer 316 is selectively deposited into the recess 342 and patterned hard mask layer 315 is removed according to one embodiment. As shown in FIG. 3D, the recess 342 in the area of the MEMS device is back-filled with pore stuffed sacrificial layer 316 through the patterned hard mask layer 315. In one embodiment, the material of the pore stuffed sacrificial layer 316 is similar to the material of the pore stuffed sacrificial layer 302. In another embodiment, the material of the pore stuffed sacrificial layer 316 is different from the material of the pore stuffed sacrificial layer 302.

In one embodiment, the pore stuffed sacrificial layer 316 is deposited to the thickness to flush with the top portions of the pore sacrificial layer 102. In one embodiment, the sacrificial layer 115 is deposited to the thickness from about 5 nm to about 20 nm. In more specific embodiment, the sacrificial layer 115 is deposited to the thickness of about 10 nm. In an embodiment, pore stuffed sacrificial layer 316 is selectively deposited through patterned hard mask layer 315 using one of deposition techniques, such as but not limited to a chemical vapour deposition ("CVD"), e.g., a plasma enhanced chemical vapour deposition ("PECVD"), a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of electronic device manufacturing. As shown in FIG. 3D, the pore stuffed sacrificial layer 316 and portions of the pore stuffed sacrificial layer 302 are recessed to a predetermined depth 339 relative to the top portions of the conductive layer 309 to deposit an etch stop layer thereon later in a process. In one embodiment, the pore stuffed sacrificial layer 316 and portions of the pore stuffed sacrificial layer 302 are recessed using one of the wet etching, dry etching, or both techniques known to one of ordinary skill in the art of electronic device manufacturing. In one embodiment, the patterned hard mask layer 315 is removed using one of the hard mask layer removal techniques known to one of ordinary skill in the art of electronic device manufacturing.

FIG. 3E is a view 340 similar to FIG. 3D after an etch stop layer 317 is deposited on pore stuffed sacrificial layer 316 and portions of pore stuffed sacrificial layer 302 according to one embodiment. The etch stop layer 317 is flushed with top portions of the conductive sidewalls of the recess 342 and top portions of conductive vias 313 and 314, as shown in FIG. 3E. In one embodiment, the material of the etch stop layer 317 is similar to the material of one of the etch stop layers 116 and 103. The thickness of the etch stop layer 317 is similar to that of the etch stop layer 116. In one embodiment, etch stop layer 317 is deposited using one of the deposition techniques described above with respect to the etch stop layers 116 and 103.

FIG. 3F is a view 350 similar to FIG. 3E after a patterned hard mask layer 318 is deposited on etch stop layer 317 and pore stuffants are removed from the pores of the sacrificial layer 316 and from the pores of a portion 319 of the pore stuffed sacrificial layer 302 according to one embodiment. The pore stuffants are removed through a portion 325 of etch stop layer 317 exposed by patterned hard mask layer 318. In one embodiment, the pore stuffant is removed using one of the dry etching techniques, e.g., an ashing technique. Generally, for a plasma ashing technique, reactive species (e.g., oxygen or fluorine reactive species) are generated using a plasma source. The reactive species are combined with the pore stuffant to form ash which is removed with a vacuum pump. That is, the pore stuffant is selectively removed by a dry etch (ash) from the sacrificial layer 316 and portion 319 of the pore stuffed sacrificial layer 302, so that the sacrificial layer 316 and portion 319 can be selectively removed using a wet chemistry later on in a process to form a MEMS device structure. As shown in FIG. 3F, portion 319 comprises a portion 324 between conductive vias 311 and 312, a portion 323 between a pore stuffed portion 352 of sacrificial layer 302 and conductive via 311, and a portion 322 between a pore stuffed portion 353 of sacrificial layer 302 and conductive via 312.

In one embodiment, hard mask layer 318 is a nitride layer, e.g., a silicon nitride, a silicon oxide nitride, or any other hard mask layer known to one of ordinary skill in the art of electronic device manufacturing. The patterned mask layer 318 can be formed using one of the hard mask layer deposition and patterning techniques known to one of ordinary skill in the art of electronic device manufacturing.

FIG. 3G is a view 360 similar to FIG. 3F after sacrificial layer 316 and portion 319 of the sacrificial layer 302 are selectively removed to form a MEMS device structure according to one embodiment. In one embodiment, sacrificial layer 316 and portion 319 of the sacrificial layer 302 from which the stuffants have been taken out are completely removed using a wet etching chemistry through porous etch stop layer 317. That is, the porous etch stop layer 317 is permeable to a wet chemistry which dissolves the portion 319 of the sacrificial layer, so that a free-standing MEMS device structure comprising a beam 333 is formed. As shown in FIG. 3G, the pore stuffed portions of the sacrificial layer 302, such as portions 352 and 353 remain intact by the wet etching chemistry.

In one embodiment, the porous portion 319 of the sacrificial layer of TiN is removed through the etch stop layer 325 of the porous carbon doped silicon oxide using a timed wet etch with a chemistry comprising a hydrogen peroxide. In one embodiment, the porous portion 319 of the sacrificial layer of TiN is removed through the etch stop layer of the porous carbon doped silicon oxide by a wet etch using a Standard Clean (SC) chemistry, such as SC 1, SC2, or both. The SC1 and SC2 chemistries are known to one of ordinary skill in the art of electronic device manufacturing. In one embodiment, the porous portion 319 of sacrificial layer of TiN is wet etched at an elevated temperature greater than a room temperature. In one embodiment, the elevated temperature to wet etch the porous portion 319 is from about 50 degrees C. to about 75 degrees C.

As shown in FIG. 3G, the MEMS device structure comprises a beam 333 over substrate 301, an interconnect contact region 334 and an interconnect contact region 335 are on beam 333. A gap 321 is between the beam 333 and etch stop layer 325. A gap 327 is formed underneath the beam 333 between conductive vias 311 and 312, as shown in FIG. 3G. A gap 329 is formed between a portion of the etch stop layer 317 outside one end of the MEMS structure, a portion of the substrate 301, portion 352 and a sidewall of the MEMS device structure. A gap 331 is formed between a portion of the etch stop layer 317 outside other end of the MEMS structure, a portion of the substrate 301, portion 353 and an opposite sidewall of the MEMS structure, as shown in FIG. 3G. In one embodiment, each of the gaps 327, 321, 329 and 331 is an air gap.

FIG. 3H is a view 370 similar to FIG. 3G after stuffing the porous material of the etch stop layer 317 to form a dense etch stop layer 326 according to one embodiment. The porous etch stop layer 317 is converted to a dense (stuffed) etch stop layer 326, as described above. In one embodiment, stuffed etch stop layer 326 represents stuffed etch stop layer 123. The stuffed etch stop layer 123 is formed using one of the porous etch stop layer stuffing techniques described above with respect to FIG. 1J.

FIG. 3I is a view 380 similar to FIG. 3H after a next interconnect layer is formed according to one embodiment. As shown in FIG. 3I, the next interconnect layer comprises an insulating layer 332 deposited on the stuffed etch stop layer 326 and conductive via 314. In one embodiment, insulating layer 332 represents insulating layer 128. Interconnects 336 and 337 are formed through insulating layer 332 on contact regions 334 and 335 respectively. An interconnect 338 is formed on conductive via 313. In one embodiment, the next interconnect layer is formed using a BEOL processing, as described above.

FIG. 4A shows a side view 400 of a portion of an electronic device according to another embodiment. An etch stop layer 403 is deposited on pore stuffed sacrificial layer 302 on substrate 301. Etch stop layer 403 represents one of the etch stop layers described above. Conductive layer 309 is deposited into the trench and via, as described above. The conductive layer 309 is deposited in the trench and via openings to form conductive vias 311, 312, 313 and 314, as described above. As shown in FIG. 4A, conductive layer 309 is flushed with portions of the etch stop layer 403. In one embodiment, the conductive layer 309 is flushed with portions of the etch stop layer 403 using one of the CMP techniques known to one of ordinary skill in the art of electronic device manufacturing.

FIG. 4B is a view 410 similar to FIG. 4A after a portion of the conductive layer 309 is removed to form a recess 402 to form a MEMS device according to one embodiment. As shown in FIG. 4B, a patterned hard mask layer 401 is deposited on the conductive layer 309, conductive vias 313 and 314 and portions of the etch stop layer 403. In one embodiment, patterned hard mask layer 401 represents one of the patterned hard mask layers described above. Recess 402 represents one of the recesses described above.

FIG. 4C is a view 420 similar to FIG. 4B after a pore stuffed sacrificial layer 423 is selectively deposited into the recess 402 through patterned hard mask layer 401 according to one embodiment. In one embodiment, pore stuffed sacrificial layer 423 represents one of the pore stuffed sacrificial layers described above. Pore stuffed sacrificial layer 423 is deposited to the thickness to flush with the top portions of the pore stuffed sacrificial layer 302, as described above with respect to FIG. 1G.

FIG. 4D is a view 430 similar to FIG. 4C after an etch stop layer 404 is deposited on sacrificial layer 423 according to one embodiment. The etch stop layer 404 is flushed with top portions of the conductive sidewalls of the recess 402 and portions of the etch stop layer 303 on sacrificial layer 302, as described above. In one embodiment, the etch stop layer 404 represents one of the etch stop layers described above.

FIG. 4E is a view 440 similar to FIG. 4D after pore stuffants are removed from the pores of the sacrificial layear 423 and from the pores of a portion 419 of the sacrificial layer 302 according to one embodiment. As shown in FIG. 4D, portion 419 comprises a portion 405 between conductive vias 311 and 312, the portion between a pore stuffed portion of sacrificial layer 302 and conductive via 311, and the portion between a pore stuffed portion of sacrificial layer 302 and conductive via 312. The pore stuffants are removed through etch stop layer 404, as described above with respect to FIG. 3F.

FIG. 4F is a view 450 similar to FIG. 4E after sacrificial layer 423 and portion 419 of the sacrificial layer 302 are selectively removed to form a MEMS device structure according to one embodiment. In one embodiment, sacrificial layer 423 and portion 419 of the sacrificial layer 302 from which the stuffants have been taken out are completely removed using a wet etching chemistry through porous etch stop layer 404, as described above with respect to FIG. 3G.

As shown in FIG. 4F, the MEMS device structure comprises a beam 451 over substrate 301, an interconnect contact region 452 and an interconnect contact region 453 are on beam 451. A gap 412 is between the beam 451 and etch stop layer 404. A gap 411 is formed underneath the beam 451 between conductive vias 311 and 312, as shown in FIG. 4F. A gap 415 is formed between a portion of the etch stop layer 303 outside one end of the MEMS structure, a portion of the substrate 301, a stuffed portion of the sacrificial layer 302 and a sidewall of the MEMS device structure. A gap 414 is formed between a portion of the etch stop layer 303 outside other end of the MEMS structure, a portion of the substrate 301, a stuffed portion of the sacrificial layer 302 and an opposite sidewall of the MEMS structure, as shown in FIG. 4F. In one embodiment, each of the gaps 411, 412, 414 and 415 is an air gap.

FIG. 4G is a view 460 similar to FIG. 4F after stuffing the porous material of the etch stop layer 303 to form a dense (stuffed) etch stop layer 413 according to one embodiment. The porous etch stop layer 303 is converted to the stuffed etch stop layer 413, as described above. In one embodiment, stuffed etch stop layer 413 represents one of the stuffed etch stop layers, as described above.

FIG. 4H is a view 470 similar to FIG. 4G after a next interconnect layer is formed according to one embodiment. As shown in FIG. 4H, the next interconnect layer comprises an insulating layer 416 deposited on the stuffed etch stop layer 413 and conductive via 314, as described above. Interconnects 417 and 419 are formed through insulating layer 416 on contact regions 452 and 453 respectively. An interconnect 419 is formed on conductive via 313, as described above.

FIG. 5A is a side view 500 of an electronic device comprising an integrated MEMS structure according to one embodiment. As shown in FIG. 5A, the integrated MEMS structure comprises a single-clamped beam 504 over a substrate 501. Substrate 501 represents one of the substrates described above. An interconnect 505 is deposited through an ILD layer 508 on an interconnect contact region adjacent to one end of the beam 504. A stuffed etch stop layer 507 is deposited over the MEMS structure, as described above. In one embodiment, the ILD layer 508 is a high-k dielectric layer. In alternative embodiments, ILD layer 508 is an oxide layer, e.g., a silicon oxide layer, a nitride layer, e.g., silicon nitride layer, an aluminum oxide, silicon oxide nitride, other oxide/nitride layer, any combination thereof, or other electrically insulating layer determined by an electronic device design. A gap 512 is formed between etch stop layer 507 and beam 504. A gap 511 is formed between the beam 504 and substrate 501. A gap 509 is formed between the portion of the etch stop layer 507 and the portion of the substrate at one end of the beam 504 and a gap 502 is formed between the portion of the etch stop layer 507 and the portion of the substrate at other end of the beam 504, as described above. In one embodiment, each of the gaps 511, 512, 509, and 502 is an air gap. A conductive via 503 is formed underneath the beam 504. An electrode 506 is formed on the stuffed etch stop layer 507, as described above.

FIG. 5B is a side view 510 of an electronic device comprising an integrated MEMS structure according to another embodiment. FIG. 5B is different from FIG. 5A in that an electrode 512 is formed on the stuffed etch stop layer 507. In alternative embodiments, electrode 512 is a control electrode, a sense electrode, or both, as described above.

Figure 6A:
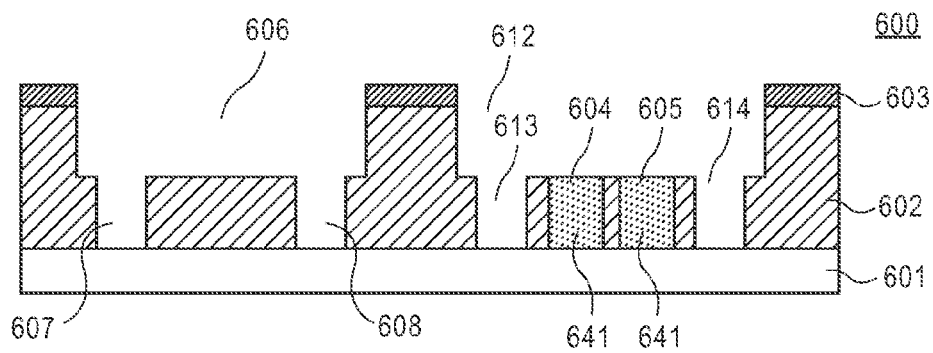
FIG. 6A shows a side view of a portion of an electronic device according to another embodiment.

FIG. 6A shows a side view 600 of a portion of an electronic device according to another embodiment. As shown in FIG. 6A, trenches 606 and 612 and via openings 607, 608, 613 and 614 are formed in a sacrificial layer 602 on a substrate 602, as a part of a BEOL processing, as described above. Substrate 602 represents one of the substrates described above. In one embodiment, sacrificial layer 602 represents sacrificial layer 102. As shown in FIG. 6A, an interlayer dielectric (ILD) layer 641 fills the via openings to form ILD columns 604 and 605. In one embodiment, ILD layer 641 is a high-k dielectric layer. In alternative embodiments, ILD layer 641 is an oxide layer, e.g., a silicon oxide layer, a nitride layer, e.g., silicon nitride layer, an aluminum oxide, silicon oxide nitride, other oxide/nitride layer, any combination thereof, or other electrically insulating layer determined by an electronic device design. In one embodiment, ILD layer 641 has an etch selectivity to sacrificial layer 602. In one embodiment, ILD layer 641 is a spin-on ILD. In another embodiment, ILD layer 641 is a hard mask layer. ILD layer 641 can be deposited into the via openings using one of ILD deposition techniques known to one of ordinary skill in the art of electronic device manufacturing.

Figure 6B:
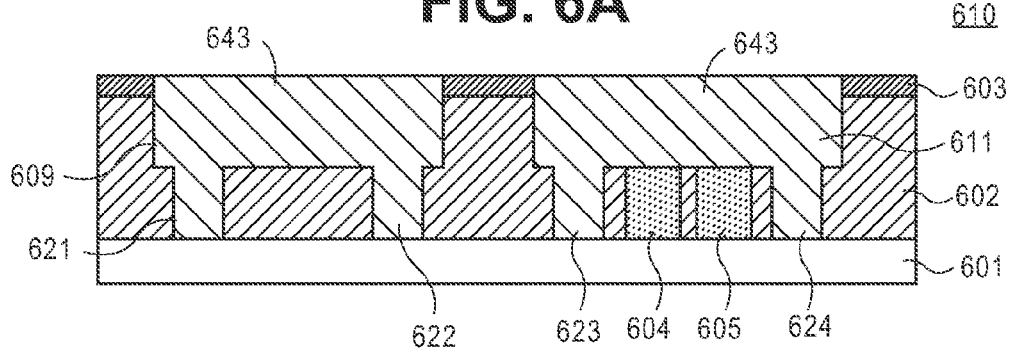
FIG. 6B is a view similar to FIG. 6A after a conductive layer is deposited into trenches and according to one embodiment.

FIG. 6B is a view 610 similar to FIG. 6A after a conductive layer 643 is deposited into trenches 606 and 612 according to one embodiment. As shown in FIG. 6B, the conductive layer 643 fills trenches 606 and 612 to form conductive trenches 609 and 612. Conductive layer 643 fills openings 607, 608, 613 and 614 to form conductive vias 621, 622, 623 and 624 respectively. The conductive layer 643 is flushed with portions of the etch stop layer 603 on sacrificial layer 602, as described above. In one embodiment, conductive layer 643 represents one of the conductive layers described above. As shown in FIG. 6B, ILD columns 604 and 605 act as supporting columns for interconnect structure 611.

Figure 6C:
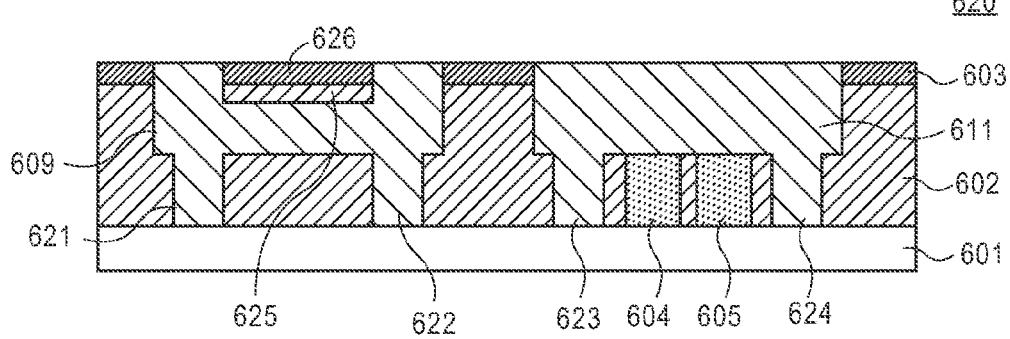
FIG. 6C is a view similar to FIG. 6B after an etch stop layer is deposited on a sacrificial layer in a recess of the conductive trench to form a MEMS structure according to one embodiment.

FIG. 6C is a view 620 similar to FIG. 6B after an etch stop layer 626 is deposited on a sacrificial layer 625 in a recess of the conductive trench 609 to form a MEMS structure according to one embodiment. In one embodiment, etch stop layer 626 represents etch stop layer 116 and sacrificial layer 625 represents sacrificial layer 115. The recess of the conductive trench 609 is formed using one of the recess forming techniques described above.

Figure 6D:
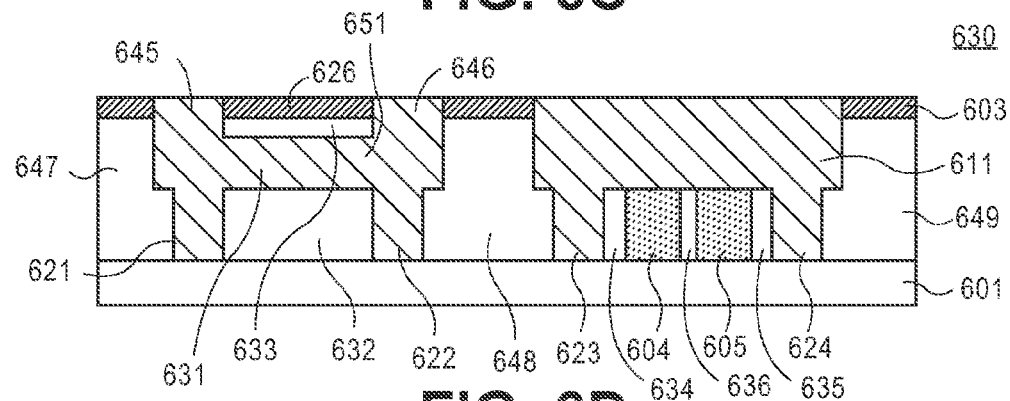
FIG. 6D is a view similar to FIG. 6C after sacrificial layers are removed according to one embodiment.

FIG. 6D is a view 630 similar to FIG. 6C after sacrificial layer 625 and sacrificial layer 602 are removed according to one embodiment. As shown in FIG. 6D, sacrificial layers 625 and 602 are completely removed through porous etch stop layers 626 and 603, as described above with respect to FIG. 1I. As shown in FIG. 6D, a MEMS structure comprises a beam (or plate) 631 over substrate 601, an interconnect contact region 645 and an interconnect contact region 646 are on beam 631. A gap 633 is between the beam 631 and etch stop layer 626. A gap 636 is underneath the beam 631 between conductive vias 621 and 622. A gap 647 is between a portion of the etch stop layer 603 outside the MEMS structure and a portion of the substrate. A gap 648 is formed between the MEMS structure 651 and interconnect structure 609. A gap 634 is formed between a conductive via 623 and ILD column 604, a gap 636 is formed between ILD columns 604 and 605, and a gap 635 is formed between ILD column 650 and conductive via 624, as shown in FIG. 6D. A gap 649 is formed between a portion of the etch stop layer 603 and a portion of substrate 601. In one embodiment, each of the gaps 632, 633, 634, 635, 636, 647, 648 and 649 is an air gap, as described above. In one embodiment, after the MEMS structure 651 is formed, the etch stop layer 603 is stuffed, and a next interconnect layer is formed on the stuffed etch stop layer, MEMS structure 651 and interconnect structure 611 using techniques as described above with respect to FIGS. 1I, 1J, and 1K.

FIG. 7 is a side view 700 of an electronic device comprising an integrated MEMS structure according to another embodiment. An integrated MEMS structure 711 structure comprises a double clamped beam 705 over a substrate 701. In one embodiment, substrate 701 represents one of the substrates described above. An interconnect 715 is deposited through an ILD layer 714 on an interconnect contact region 712 adjacent to one end of beam 705, and interconnect 717 is deposited on the interconnect contact region adjacent to other end of the beam 705, as shown in FIG. 7. A stuffed etch stop layer 713 is deposited over the MEMS structure, as described above. A gap 707 is formed between etch stop layer 713 and beam 705. A gap 706 is formed between the beam 705 and substrate 701. A gap 709 is formed between the portion of the etch stop layer 713 and the portion of the substrate 701 at one end of the beam 705 and a gap 702 is formed between the portion of the etch stop layer 713 and the portion of the substrate 701 at other end of the beam 705, as described above. In one embodiment, each of the gaps 702, 706, 707 and 709 is an air gap. Conductive vias 704 and 705 are formed underneath the beam 705. An electrode 716 is formed on the stuffed etch stop layer 713, as described above. In one embodiment, electrode 716 is a sense electrode, a control electrode, or both, as described above. As shown in FIG. 7, MEMS structure 711 comprises a metal liner 718 and a fillable material layer 719 is deposited on metal liner 718 using one of the techniques as described above with respect to FIG. 1E. In one embodiment, fillable material layer 719 is a conductive layer, as described above with respect to FIG. 1E. In more specific embodiment, a metal liner 718 is a tantalum liner, and fillable material layer 719 is a conductive layer, e.g., copper. In another embodiment, fillable material layer 719 is an insulating layer having a substantially high stiffness (e.g., Young's modulus) to increase a resonance frequency of the beam 705 (e.g., a silicon nitride, a silicon carbide, or other high stiffness insulating layer, or any combination thereof). In one embodiment, the metal liner 718 and fillable material layer 719 are deposited using one of the liner and fillable material deposition techniques, such as but not limited to electroless plating, electroplating, sputtering, chemical vapor deposition (CVD), metalorganic chemical vapor deposition (MOCVD), atomic layer deposition (ALD), or any other known deposition technique known to one of ordinary skill in the art of electronic device manufacturing.

Simulations using BEOL materials and sizes for a MEMS structure comprising a resonator beam show that there is a sufficient signal and resonant frequencies that are applicable for MEMS resonator applications. Examples of simulations are below.

Figure 8:
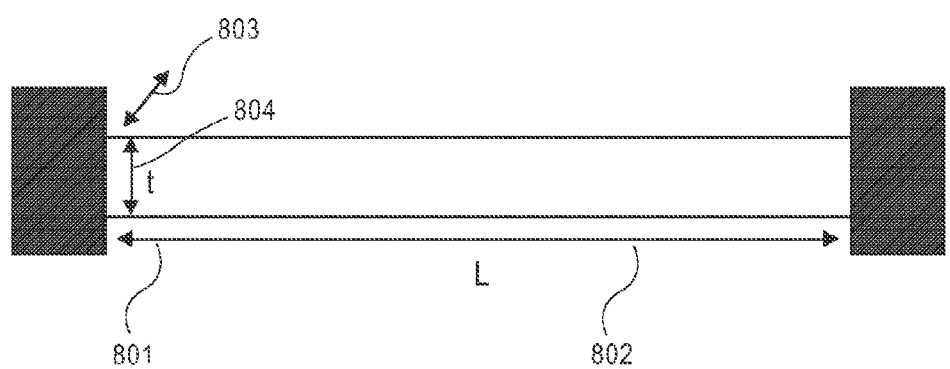
FIG. 8 is a diagram illustrating a side view of a double clamped beam for a MEMS resonator application according to one embodiment.
Figure 9:
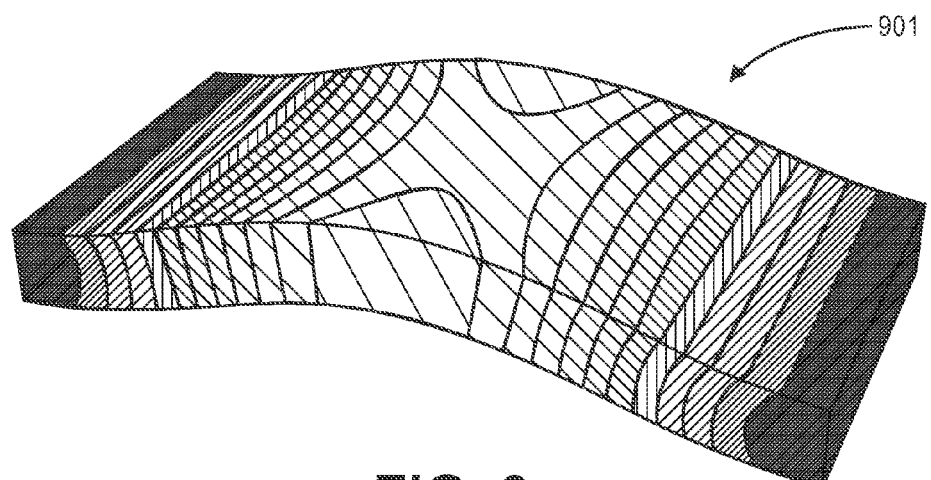
FIG. 9 is a three dimensional view of the double clamped beam according to one embodiment.

FIG. 8 is a diagram 800 illustrating a double clamped beam 801 for a MEMS resonator application according to one embodiment. FIG. 9 is a three dimensional view 901 of double clamped beam 801 according to one embodiment. The beam 801 has a length L 802, a width w 803, and a thickness t 804. In one embodiment, the beam has the following properties: length L is about 200 nm; width w is about 100 nm; thickness t is about 20 nm; Young modulus E is about 128 GPa (copper modulus); density: rho is about 8960 kg/m^3 (copper density); mass m is about $3.584e^{-18}$ kg; and $2^{nd}$ moment of inertia: 1 is about $1/12*w*t^3 = 6.66e^{-32}$ m^4. Analytical solution and finite element model for double clamped beam 801 provide a resonance frequency of about 1.9 GHz. Effective spring constant k is about 530 N/m.

Figure 10:
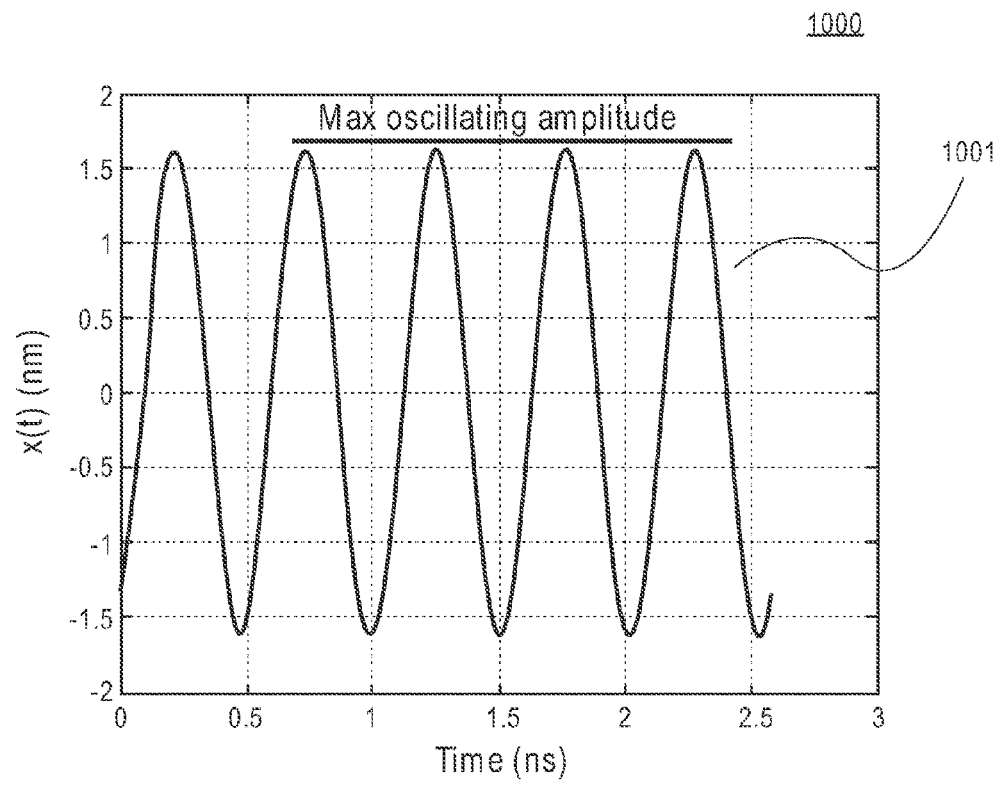
FIG. 10 shows a graph of an oscillating amplitude versus time for a double clamped beam according to one embodiment.

FIG. 10 shows a graph 1000 of an oscillating amplitude (nm) versus time (ns) for double clamped beam 801 according to one embodiment. A curve 1001 shows that the maximum oscillating amplitude is about 1.7 nm.

Figure 11:
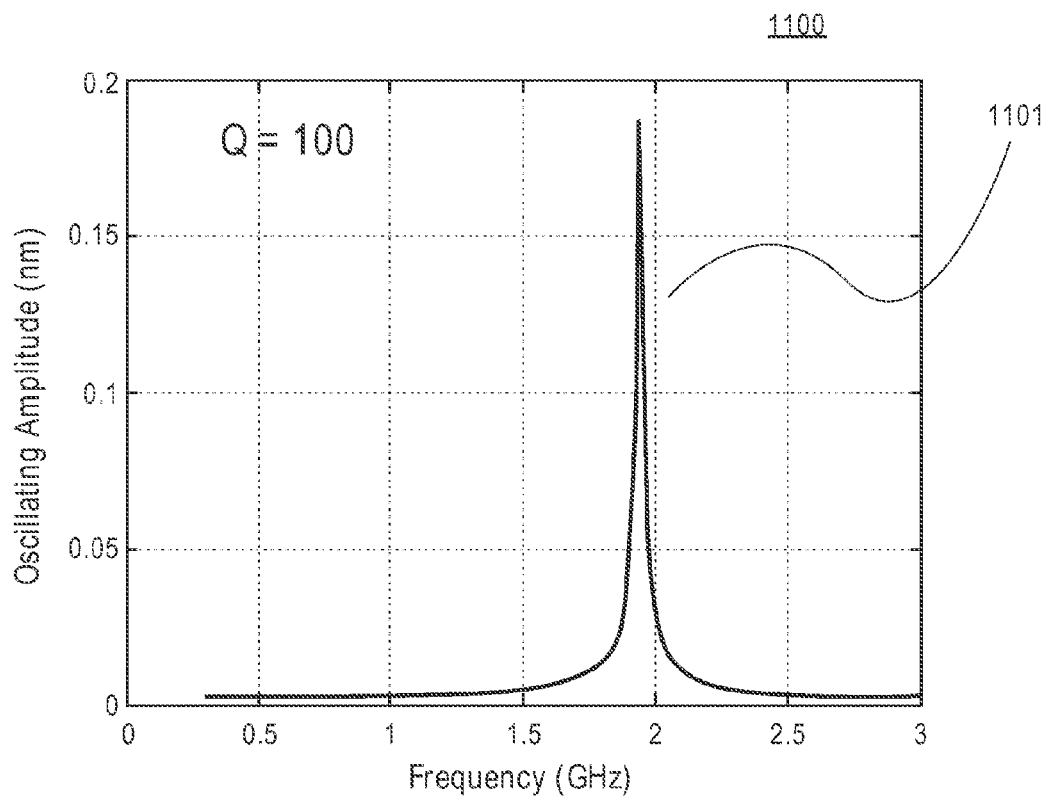
FIG. 11 shows a graph of an oscillating amplitude versus frequency for a double clamped beam having a Q-factor of about 100 according to one embodiment.

FIG. 11 shows a graph 1100 of an oscillating amplitude (nm) versus frequency (GHz) for double clamped beam 801 having a Q-factor of about 100 according to one embodiment. A curve 1101 shows that the resonance frequency is about 1.9GHz.

Figure 12:
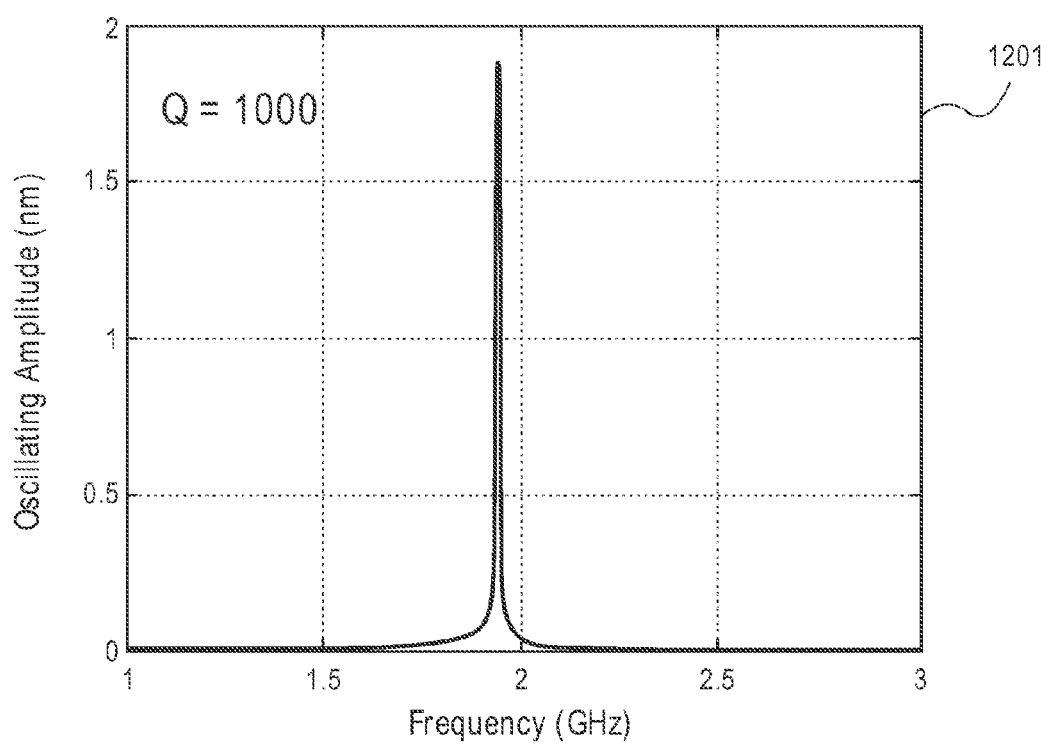
FIG. 12 shows a graph of an oscillating amplitude versus frequency for a double clamped beam having a Q-factor of about 1000 according to one embodiment.

FIG. 12 shows a graph 1200 of an oscillating amplitude (nm) versus frequency (GHz) for double clamped beam 801 having a Q-factor of about 1000 according to one embodiment. A curve 1201 shows that the resonance frequency is about 1.9 GHz. In one embodiment, for beam 801 having length L about 200 nm, width W about 100 nm, and air gap g about 10 nm, the voltage bias Vdc is estimated to be about 2.0 V, a maximum AC voltage Vac max is about 0.3 V, and a force amplitude Famp is about 1 nN. The capacitive current for the resonator beam 801 is about 8E-9A, which is advantageously orders of magnitude above the noise floor of the MEMS systems.

Figure 13:
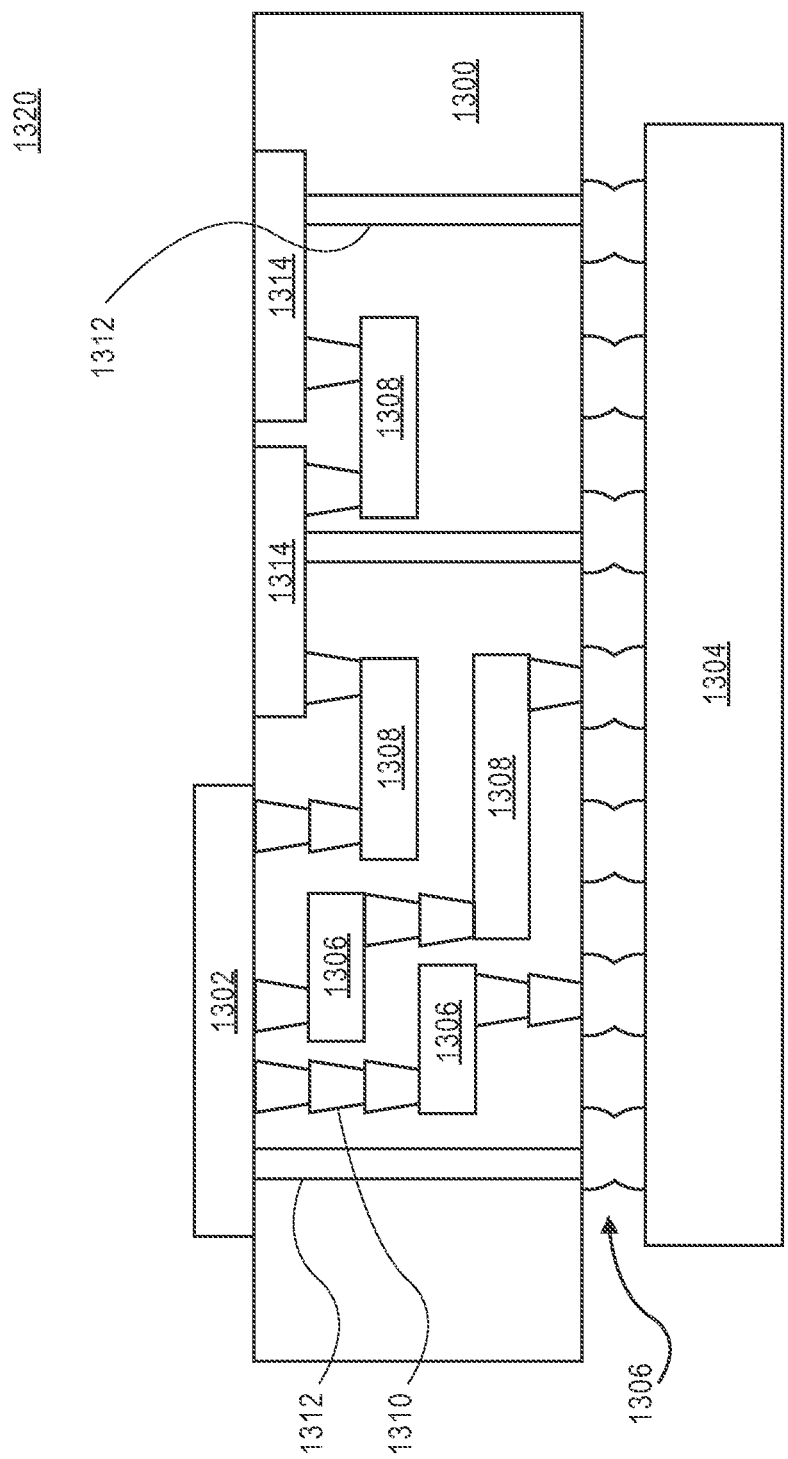
FIG. 13 illustrates an interposer that includes one or more embodiments of the invention.

FIG. 13 illustrates an interposer 1300 that includes one or more embodiments of the invention. The interposer 1300 is an intervening substrate used to bridge a first substrate 1302 to a second substrate 1304. The first substrate 1302 may be, for instance, an integrated circuit die. The second substrate 1304 may be, for instance, a memory module, a computer motherboard, or another integrated circuit die. Generally, the purpose of an interposer 1300 is to spread a connection to a wider pitch or to reroute a connection to a different connection. For example, an interposer 1300 may couple an integrated circuit die to a ball grid array (BGA) 1306 that can subsequently be coupled to the second substrate 1304. In some embodiments, the first and second substrates 1302/1304 are attached to opposing sides of the interposer 1300. In other embodiments, the first and second substrates 1302/1304 are attached to the same side of the interposer 1300. And in further embodiments, three or more substrates are interconnected by way of the interposer 1300.

The interposer 1300 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1308 and vias 1310, including but not limited to through-silicon vias (TSVs) 1312. The interposer 1300 may further include embedded devices 1314, including passive and active devices. Such devices include, but are not limited to, MEMS devices as described herein, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1300. In accordance with embodiments of the invention, apparatuses or processes disclosed herein may be used in the fabrication of interposer 1300.

Figure 14:
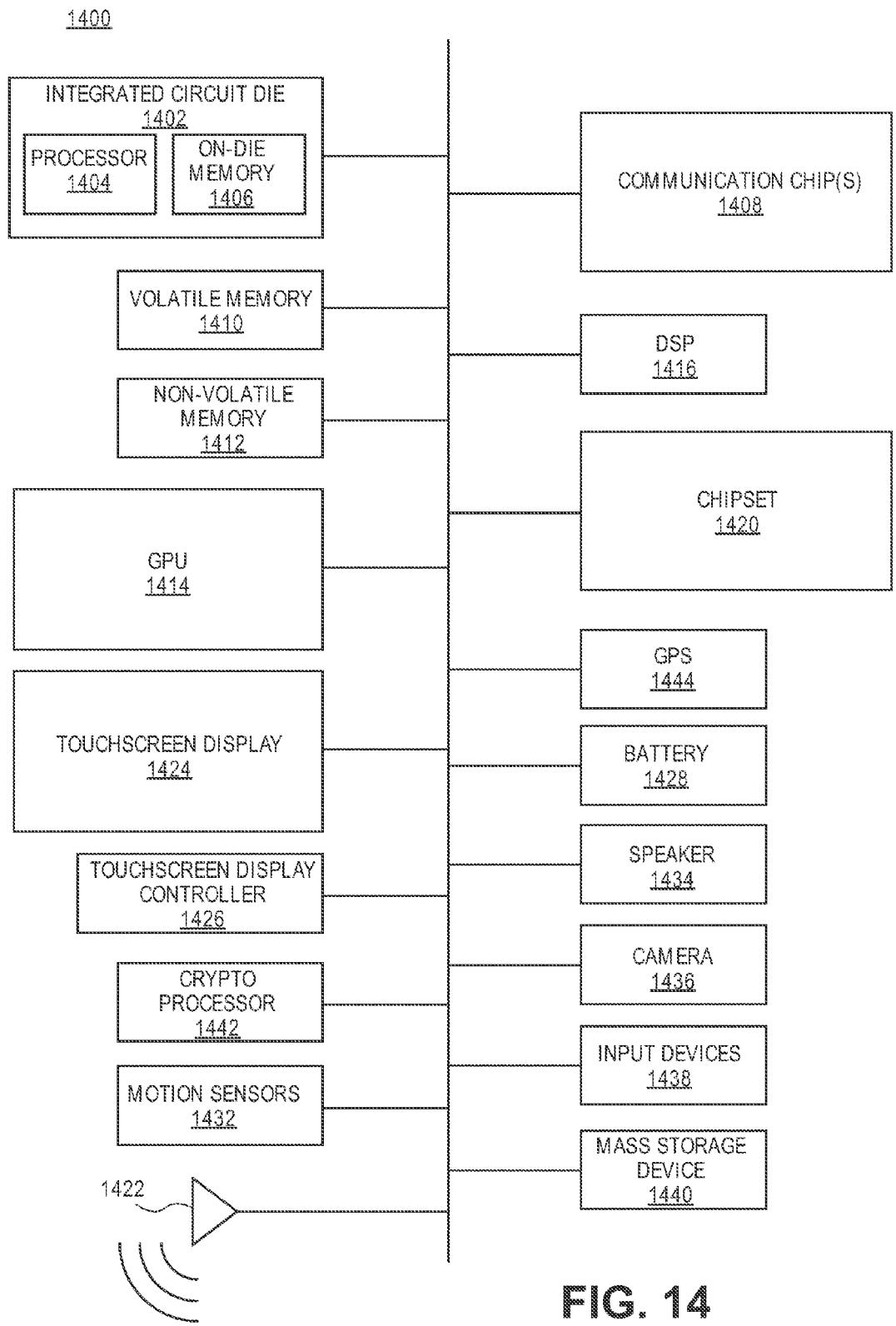
FIG. 14 illustrates a computing device in accordance with one embodiment of the invention.

FIG. 14 illustrates a computing device 1400 in accordance with one embodiment of the invention. The computing device 1400 may include a number of components. In one embodiment, these components are attached to one or more motherboards. In an alternate embodiment, these components are fabricated onto a single system-on-a-chip (SoC) die rather than a motherboard. The components in the computing device 1400 include, but are not limited to, an integrated circuit die 1402 and at least one communication chip 1408. In some implementations the communication chip 1408 is fabricated as part of the integrated circuit die 1402. The integrated circuit die 1402 may include a processor 1404 such as a central processing unit (CPU), an on-die memory 1406, often used as cache memory, that can be provided by technologies such as embedded DRAM (eDRAM) or spin-transfer torque memory (STTM or STTM-RAM).

Computing device 1400 may include other components that may or may not be physically and electrically coupled to the motherboard or fabricated within an SoC die. These other components include, but are not limited to, a volatile memory 1410 (e.g., DRAM), a non-volatile memory 1412 (e.g., ROM or flash memory), a graphics processing unit 1414 (GPU), a digital signal processor 1416 (DSP), a crypto processor 1442 (a specialized processor that executes cryptographic algorithms within hardware), a chipset 1420, an antenna 1422, a display or a touchscreen display 1424, a touchscreen display controller 1426, a battery 1428 or other power source, a global positioning system (GPS) device 1444, a power amplifier (PA), a compass, a motion coprocessor or sensors 1432 (that may include an accelerometer, a gyroscope, and a compass), a speaker 1434, a camera 1436, user input devices 1438 (such as a keyboard, mouse, stylus, and touchpad), and a mass storage device 1440 (such as hard disk drive, compact disk (CD), digital versatile disk (DVD), and so forth).

The communication chip 1408 enables wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1408 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1400 may include a plurality of communication chips 1408. For instance, a first communication chip 1408 may be dedicated to shorter range wireless communications such as Wi-Fi and Bluetooth and a second communication chip 1408 may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory. One or more components e.g., integrated circuit die 1302, communication chip 1308, GPU 1314, cryptoprocessor 1342, DSP 1316, chipset 1320, and other components may include one or more MEMS devices formed in accordance with embodiments of the invention. In further embodiments, another component housed within the computing device 1400 may contain one or more MEMS devices formed in accordance with embodiments of the invention.

In various embodiments, the computing device 1400 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1400 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The following examples pertain to further embodiments:

In one embodiment, a method to manufacture an electronic device comprises depositing a first conductive layer into a trench in a first sacrificial layer in a back end of line (BEOL) area on a substrate; depositing an etch stop layer over the first conductive layer; and removing the first sacrificial layer to form a beam clamped by one or more vias.

In one embodiment, a method to manufacture an electronic device comprises depositing a first conductive layer into a trench in a first sacrificial layer in a BEOL area on a substrate; removing a portion of the first conductive layer to form a recess; depositing a second sacrificial layer into the recess, depositing an etch stop layer on the second sacrificial layer;

removing the first sacrificial layer to form a gap and removing the second sacrificial layer to form a gap.

In one embodiment, a method to manufacture an electronic device comprises
depositing a first conductive layer into a trench in a first sacrificial layer in a BEOL area on a substrate; depositing an insulating layer on the first conductive layer, depositing an etch stop layer over the first conductive layer; and removing the first sacrificial layer to form a gap.

In one embodiment, a method to manufacture an electronic device comprises
depositing a first conductive layer into a trench in a first sacrificial layer in a BEOL area on a substrate; depositing a second conductive layer on the first conductive layer, depositing an etch stop layer over the first conductive layer; and removing the first sacrificial layer to form a gap, wherein the first conductive layer comprises a copper layer, a tantalum layer, a tungsten layer, a ruthenium layer, or any combination thereof.

In one embodiment, a method to manufacture an electronic device comprises
depositing a first conductive layer into a trench in a first sacrificial layer in a BEOL area on a substrate;
depositing an etch stop layer over the first conductive layer; and removing the first sacrificial layer to form a gap, wherein the first sacrificial layer is a titanium nitride layer.

In one embodiment, a method to manufacture an electronic device comprises
depositing a first conductive layer into a trench in a first sacrificial layer on a substrate;
depositing an etch stop layer over the first conductive layer; and removing the first sacrificial layer to form a gap, and removing a pore stuffant from the first sacrificial layer.

In one embodiment, a method to manufacture an electronic device comprises
depositing a first conductive layer into a trench in a first sacrificial layer in a BEOL area on a substrate;
depositing an etch stop layer over the first conductive layer; and removing the first sacrificial layer to form a gap, wherein the etch stop layer is a porous layer.

In one embodiment, a method to manufacture a MEMS structure comprises
depositing a first conductive layer into a trench in a first sacrificial layer in a BEOL area on a substrate;
depositing a second sacrificial layer on the first conductive layer; depositing an etch stop layer on the second sacrificial layer; and removing at least one of the first sacrificial layer and the second sacrificial layer.

In one embodiment, a method to manufacture a MEMS structure comprises
depositing a first conductive layer into a trench in a first sacrificial layer in a BEOL area on a substrate; removing a portion of the first conductive layer to form a recess, depositing a second sacrificial layer into the recess on the first conductive layer; depositing an etch stop layer on the second sacrificial layer; and removing at least one of the first sacrificial layer and the second sacrificial layer.

In one embodiment, a method to manufacture a MEMS structure comprises
depositing a first conductive layer into a trench in a first sacrificial layer in a BEOL area on a substrate;
depositing a second sacrificial layer on the first conductive layer; depositing an etch stop layer on the second sacrificial layer; removing at least one of the first sacrificial layer and the second sacrificial layer; and staffing the etch stop layer.

In one embodiment, a method to manufacture a MEMS structure comprises
forming a trench in a first sacrificial layer in a BEOL area on a substrate; forming one or more vias underneath the trench; depositing a first conductive layer into the trench and the one or more vias; depositing a second sacrificial layer on the first conductive layer; depositing an etch stop layer on the second sacrificial layer; and removing at least one of the first sacrificial layer and the second sacrificial layer.

In one embodiment, a method to manufacture a MEMS structure comprises
depositing a first conductive layer into a trench in a first sacrificial layer on a substrate;
depositing a second sacrificial layer on the first conductive layer; depositing an etch stop layer on the second sacrificial layer; removing a pore stuffant from a portion of at least one of the first sacrificial layer and the second sacrificial layer; and removing the portion of at least one of the first sacrificial layer and the second sacrificial layer.

In one embodiment, a method to manufacture a MEMS structure comprises
depositing a first conductive layer into a trench in a first sacrificial layer in a BEOL area on a substrate;
depositing a second sacrificial layer on the first conductive layer; depositing an etch stop layer on the second sacrificial layer; removing at least one of the first sacrificial layer and the second sacrificial layer; depositing an insulating layer on the etch stop layer; and
forming one or more interconnects through the insulating layer.

In one embodiment, an electronic device comprises a (BEOL) structure comprising a beam over a substrate, wherein beam is clamped by one or more vias.

In one embodiment, an electronic device comprises a BEOL structure comprising a beam over a substrate, wherein the beam is clamped by one or more vias; an etch stop layer over the beam, and a gap between the beam and the etch stop layer.

In one embodiment, an electronic device comprises a (BEOL) structure comprising a beam over a substrate, wherein the beam is clamped by one or more vias; and a gap underneath the beam.

In one embodiment, an electronic device comprises a (BEOL) structure comprising a beam over a substrate, wherein the beam is clamped by one or more vias underneath the beam.

In one embodiment, an electronic device comprises a (BEOL) structure comprising a beam over a substrate, wherein the beam is clamped by one or more vias; and an electrode above the beam.

In one embodiment, an electronic device comprises a (BEOL) structure comprising a beam over a substrate, wherein the beam is clamped by one or more vias; and at least one interconnect on the beam.

In one embodiment, an electronic device comprises a (BEOL) structure comprising a beam over a substrate, wherein the beam is clamped by one or more vias; a second via on the substrate;
a conductive trench on the second via; and an insulating column underneath the trench adjacent to the second via an insulating column underneath the trench adjacent to the second via.

In one embodiment, an electronic device comprises a beam over a substrate; a first interconnect on the beam; a first via underneath the beam; an etch stop layer over the beam, a first gap between the beam and the etch stop layer, wherein a second gap is adjacent to the first via.

In one embodiment, an electronic device comprises a beam over a substrate; a first interconnect on the beam; an etch stop layer over the beam, a first gap between the beam and the etch stop layer, and an electrode on the etch stop layer.

In one embodiment, an electronic device comprises a beam over a substrate; a first interconnect and a second interconnect on the beam; an etch stop layer over the beam, and a first gap between the beam and the etch stop layer.

In one embodiment, an electronic device comprises a beam over a substrate; a first interconnect on the beam; an etch stop layer over the beam, and a first gap between the beam and the etch stop layer; a via on the substrate; a conductive trench on the via; and an insulating column underneath the trench adjacent to the second via.

In the foregoing specification, methods and apparatuses have been described with reference to specific exemplary embodiments thereof. It will be evident that various modifications may be made thereto without departing from the broader spirit and scope of embodiments as set forth in the following claims. The specification and drawings are, accordingly, to be regarded in an illustrative sense rather than a restrictive sense.

What is claimed is:

1. An electronic device comprising:
   a back end of line (BEOL) structure comprising a beam over a substrate, wherein the beam is clamped by one or more vias; and
   a conductive interconnect contact region on and above the beam, the conductive interconnect contact region vertically over one of the one or more vias, wherein the conductive interconnect contact region, the beam and the one of the one or more vias are monolithic and comprise a continuous metal liner along sidewalls of the conductive interconnect contact region, the beam and the one of the one or more vias.

2. The electronic device of claim 1, further comprising an etch stop layer over the beam, and a first gap between the beam and the etch stop layer.

3. The electronic device of claim 1, further comprising a second gap underneath the beam.

4. The electronic device of claim 1, wherein the one or more vias are underneath the beam.

5. The electronic device of claim 1, further comprising an electrode above the beam.

6. The electronic device of claim 1, further comprising at least one interconnect on the beam.

7. The electronic device of claim 1, further comprising a second via on the substrate; a conductive trench on the second via; and an insulating column underneath the trench adjacent to the second via.

8. A method to manufacture an electronic device, comprising:
   depositing a first conductive layer into a trench in a first sacrificial layer in a back end of line (BEOL) area on a substrate;
   removing a portion of the first conductive layer to form a recess;
   depositing a second sacrificial layer into the recess;
   depositing an etch stop layer on the second sacrificial layer and over the first conductive layer;
   removing the first sacrificial layer to form a beam clamped by one or more vias; and
   removing the second sacrificial layer.

9. The method of claim 8, wherein the beam is a part of a MEMS device formed simultaneously with a complementary metal-oxide semiconductor (CMOS) BEOL processing.

10. The method of claim 8, further comprising depositing an insulating layer on the first conductive layer.

11. The method of claim 8, further comprising depositing a second conductive layer on the first conductive layer.

12. The method of claim 8, wherein the first conductive layer comprises a copper layer, a tantalum layer, a tungsten layer, a ruthenium layer, or any combination thereof.

13. The method of claim 8, wherein the first sacrificial layer is a titanium nitride layer.

14. The method of claim 8, further comprising removing a pore stuffant from the first sacrificial layer.

15. The method of claim 8, wherein the etch stop layer is a porous layer.

16. A method to manufacture a MEMS structure, comprising:
   depositing a first conductive layer into a trench in a first sacrificial layer in a back end of line (BEOL) area on a substrate;
   removing a portion of the first conductive layer to form a recess;
   depositing a second sacrificial layer on the first conductive layer, wherein the second sacrificial layer is deposited into the recess;
   depositing an etch stop layer on the second sacrificial layer; and
   removing at least one of the first sacrificial layer and the second sacrificial layer to form a beam clamped by one or more vias.

17. The method of claim 16, wherein the beam is a part of a MEMS device formed simultaneously with a complementary metal-oxide semiconductor (CMOS) BEOL processing.

18. A method to manufacture a MEMS structure, comprising:
   depositing a first conductive layer into a trench in a first sacrificial layer in a back end of line (BEOL) area on a substrate;
   depositing a second sacrificial layer on the first conductive layer;
   depositing an etch stop layer on the second sacrificial layer;
   removing at least one of the first sacrificial layer and the second sacrificial layer to form a beam clamped by one or more vias; and
   stuffing the etch stop layer after the removing.

19. The method of claim 16, wherein the one or more vias are formed underneath the trench, wherein the first conductive layer is deposited into the one or more vias.

20. The method of claim 16, further comprising removing a pore stuffant from a portion of at least one of the first sacrificial layer and the second sacrificial layer.

21. The method of claim 16, further comprising depositing an insulating layer on the etch stop layer; and
   forming one or more interconnects through the insulating layer.

* * * * *